(12) United States Patent
Yamaji

(10) Patent No.: US 8,633,563 B2
(45) Date of Patent: Jan. 21, 2014

(54) HIGH-VOLTAGE INTEGRATED CIRCUIT DEVICE

(71) Applicant: Fuji Electric Co., Ltd., Kawasaki (JP)

(72) Inventor: Masaharu Yamaji, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/738,652

(22) Filed: Jan. 10, 2013

(65) Prior Publication Data

US 2013/0127524 A1 May 23, 2013

Related U.S. Application Data

(63) Continuation of application No. PCT/JP2012/056373, filed on Mar. 13, 2012.

(30) Foreign Application Priority Data

Mar. 15, 2011 (JP) ................................. 2011-056577

(51) Int. Cl.
  *H01L 21/76* (2006.01)
(52) U.S. Cl.
  USPC ........................................................ 257/499
(58) Field of Classification Search
  USPC .................. 257/360, 350, 499, 500, 501, 343
  See application file for complete search history.

(56) References Cited

U.S. PATENT DOCUMENTS

| 6,597,550 B1 | 7/2003 | Chey et al. | |
|---|---|---|---|
| 8,269,304 B2 * | 9/2012 | Oh et al. | 257/501 |
| 8,476,736 B2 * | 7/2013 | Lee et al. | 257/547 |
| 8,513,087 B2 * | 8/2013 | Disney et al. | 438/418 |

(Continued)

FOREIGN PATENT DOCUMENTS

| JP | 11-214532 A | 8/1999 |
|---|---|---|
| JP | 2011-025235 A | 1/2001 |

(Continued)

OTHER PUBLICATIONS

International Search Report Issued in PCT/JP2012/056373 dated Jun. 5, 2012.

*Primary Examiner* — Nathan Ha
(74) *Attorney, Agent, or Firm* — Rossi, Kimms & McDowell LLP

(57) ABSTRACT

A high-voltage integrated circuit device can include, in a surface layer of a p semiconductor substrate, an n region which is a high-side floating-potential region, an $n^-$ region which becomes a high-voltage junction terminating region, and an $n^-$ region which is an L-VDD potential region. A low-side circuit portion can be disposed in an $n^-$ region. Below a pickup electrode disposed in the high-voltage junction terminating region, a universal contact region in Ohmic contact with the pickup electrode can be disposed. The universal contact region has a $p^+$ region and an $n^+$ region that can be disposed in alternating contact along a surface of the p semiconductor substrate. By disposing the universal contact region in this way, the quantity of carriers flowing into the low-side circuit portion can be reduced when a negative surge voltage is input. Consequently, erroneous operation due to latchup of a logic portion can be minimized.

7 Claims, 16 Drawing Sheets

(56) References Cited

U.S. PATENT DOCUMENTS

| | | | |
|---|---|---|---|
| 2002/0145164 A1* | 10/2002 | Kunz et al. | 257/360 |
| 2002/0153571 A1* | 10/2002 | Mergens et al. | 257/358 |
| 2002/0185688 A1* | 12/2002 | Wu et al. | 257/360 |
| 2003/0151109 A1* | 8/2003 | Taniguchi et al. | 257/500 |
| 2005/0134533 A1 | 6/2005 | Sasada et al. | |
| 2005/0189603 A1 | 9/2005 | Inao et al. | |
| 2006/0102981 A1 | 5/2006 | Seike et al. | |
| 2009/0085117 A1 | 4/2009 | Harada et al. | |

FOREIGN PATENT DOCUMENTS

| | | |
|---|---|---|
| JP | 3346763 B2 | 9/2002 |
| JP | 2005-175454 A | 6/2005 |
| JP | 2005-252235 A | 9/2005 |
| JP | 2006-140302 A | 6/2006 |
| JP | 2008-301160 A | 12/2008 |
| JP | 2009-147378 A | 7/2009 |

* cited by examiner

111 · · · SEMICONDUCTOR DEVICE (HVIC)
112 · · · POWER SUPPLY (LOW SIDE)
113 · · · POWER SUPPLY (HIGH SIDE)
114 · · · IGBT (LOW SIDE)
115 · · · IGBT (HIGH SIDE)
116 · · · FWD (LOW SIDE)
117 · · · FWD (HIGH SIDE)
118 · · · LOAD (L LOAD)
119 · · · DETECTION SIGNAL PATH

43 ··· p-CHANNEL MOSFET
72 ··· LEVEL-SHIFTING RESISTOR
76 ··· DIODE
102 ··· OUTPUT PORTION

HIGH-VOLTAGE INTEGRATED CIRCUIT DEVICE

CROSS-REFERENCE TO RELATED APPLICATIONS

This application is a continuation of International Application No. PCT/JP2012/056373, filed on Mar. 13, 2012, which is based on and claims priority to Japanese Patent Application No. JP 2011-056577, filed on Mar. 15, 2011. The disclosure of the Japanese priority application and the PCT application in their entirety, including the drawings, claims, and the specification thereof, are incorporated herein by reference.

BACKGROUND

1. Field of the Invention

This invention relates to high-voltage integrated circuit devices.

2. Related Arts

High-voltage integrated circuits (HVICs) are well known as means for on-off driving of switching power devices forming the upper arms of bridge circuits for power inversion (DC-AC conversion) such as PWM inverters. Recently, element separation-type HVICs using high-voltage junctions, not requiring potential insulation by a transformer, photocoupler or similar, have been adopted to enhance functionality of switching power devices through overcurrent detection and temperature detection when an abnormality occurs, and to decrease the size and reduce the costs of power supply systems.

FIG. 9 is an explanatory diagram showing an example of connection of switching devices forming an inverter or other power conversion device and a conventional HVIC which drives the devices. FIG. 9 shows an example of a half bridge in which two switching devices (here, IGBTs (insulated gate bipolar transistors) 114 and 115) are connected in series. The power conversion device shown in FIG. 9 outputs a high potential or a low potential in alternation from the Vs terminal, which is the output terminal, by turning on the upper-arm IGBT 115 and the lower-arm IGBT 114 of the half-bridge in alternation, to supply AC power to the L load 118.

That is, when outputting high potential, the IGBT 114 and IGBT 115 are made to operate such that the upper-arm IGBT 115 is turned on and the lower-arm IGBT 114 is turned off. On the other hand, when outputting low potential, the IGBT 114 and IGBT 115 are made to operate such that the upper-arm IGBT 115 is turned off and the lower-arm IGBT 114 is turned on. The diodes connected to be antiparallel with the IGBTs 114 and 115 are free wheel diodes (FWDs) 116 and 117.

During an operation interval, in the driving element HVIC 111 a GND-reference gate signal is output from L-OUT to the lower-arm IGBT 114, and a gate signal with the Vs terminal potential as reference is output from H-OUT to the upper-arm IGBT 115. A signal with the Vs terminal potential as reference is output from H-OUT, and so the HVIC 111 must be provided with a level shift function.

Among the symbols in FIG. 9, Vss indicates the high-potential side of the high-voltage power supply (main circuit power supply), and GND is ground. Vs is an intermediate potential, fluctuating from the Vss potential to GND potential. H-VDD is the high-potential side of the low-voltage power supply 113 which takes the Vs terminal potential as reference. L-VDD is the high-potential side of the low-voltage power supply 112 which takes GND as reference.

H-IN is the input signal and input terminal for input to the gate of the CMOS circuit on the low side connected with a level-raising circuit. L-IN is the input signal and input terminal for input to the gate of the CMOS circuit on the low side connected with the gate of the lower-arm IGBT 114.

As explained above, H-OUT is the output signal and output terminal of the high-side CMOS circuit which is output to the gate of the upper-arm IGBT 115. L-OUT is the output signal and output terminal which is output to the gate of the lower-arm IGBT 114.

ALM-IN is the input signal and input terminal for a detection signal 119 when temperature and overcurrent of the upper-arm IGBT 115 are detected. ALM-OUT is the output signal and output terminal of the detection signal with level lowered.

FIG. 10 and FIG. 11 are circuit diagrams of a level shift circuit and peripheral circuits. FIG. 10 is a circuit diagram including a level-raising circuit, and FIG. 11 is a circuit diagram including a level-lowering circuit. In FIG. 10 and FIG. 11, the symbol 120 indicates the terminal on the high-potential side of the low-voltage power supply 113 with the Vs terminal as reference. In this Specification and the attached drawings, layers and regions modified by "n" or "p" have electrons and holes, respectively, as the majority carriers. Moreover, an "n" or "p" modified by a "+" or "−" indicates that the impurity concentration is higher and lower, respectively, than in a layer or region without these symbols.

As the peripheral circuits, a low-side CMOS circuit (PMOS and NMOS) which transmits the input signal of the level-shift circuit (low-side circuit portion), and a high-side CMOS circuit (PMOS and NMOS) which transmits the output signal (output from the output portion 101) of the level-shift circuit (level-raising circuit or level-lowering circuit) to the upper-arm IGBT 115 (high-side circuit portion), are shown. The symbol 71 in FIG. 10 is a level-shifting resistor. The symbol 75 is a diode which raises the voltage of a bootstrap capacitor, not shown, and is a bootstrap diode which products a higher voltage by the amount of the bootstrap voltage (equivalent to the voltage of the low-voltage power supply 113) than the voltage Vs. The voltage of this low-voltage power supply 113 and the voltage of the low-voltage power supply 112 are the same.

In FIG. 10, when an input signal (H-IN) is input to the low-side circuit portion, the signal passes through the CMOS circuit of the low-side circuit portion and is input to the gate of the n-channel MOSFET 41 of the level-raising circuit. This signal turns the n-channel MOSFET 41 on and off, the output signal of the level-raising circuit is output from the output portion 101, and by means of this signal the CMOS circuit of the high-side circuit portion is turned on and off and the output signal (H-OUT) is output. This output signal is converted into a signal which takes the Vs terminal potential as reference. The output signal is input to the gate of the upper-arm IGBT 115, and the upper-arm IGBT 115 is turned on and off. The level-raising circuit in FIG. 10 is necessary when the upper-arm IGBT 115 is an n-channel device.

In FIG. 11, the level-lowering circuit is formed of a p-channel MOSFET 43 and a level-shifting resistor 72. A diode 76 is connected in parallel with the level-shifting resistor 72. The ALM-IN signal is input to the gate of the CMOS circuit of the high-side circuit portion, and the output signal of the CMOS circuit is input to the gate of the p-channel MOSFET 43 of the level-lowering circuit. By this means, the p-channel MOSFET 43 is turned on and off. By turning the p-channel MOSFET 43 on and off, a signal is output from the output portion 102 of the level-lowering circuit to the low side (low-side circuit portion). And, the level-lowered ALM-OUT signal from the output of the CMOS circuit of the low-side circuit portion is output from the low-circuit circuit portion as a detection signal.

In the HVIC 111 shown in FIG. 9, terminals for input/output of each of the signals described above (H-VDD, H-OUT, ALM-IN, L-VDD, L-OUT, GND, H-IN, ALM-OUT and L-IN) are shown. These correspond to the terminals in FIG. 10 and FIG. 11.

Bridge circuits created by combining half-bridge circuits formed using the switching devices (IGBTs 114 and 115) shown in FIG. 9 are widely in numerous fields, such as in home-use inverters for large-capacity PDPs (Plasma Display Panels), liquid crystal panels and other power supply applications, air conditioners and lighting, in addition to inverters for motor control.

Because such motors, lighting and similar become inductive loads (L loads) 118 such as shown in FIG. 9, there is an effect of parasitic inductance components and similar due to wiring on the printed circuit board, the cable up to the L load 118 and similar. That is, when the IGBT 115 of the upper arm is turned off, and when switching so that the lower-arm IGBT 114 is turned on, there is a shift to the negative-potential side relative go ground potential (the potential of the GND terminal in FIG. 9) of the potential at the Vs terminal which is the high-potential side reference potential of the high-side circuit portion forming the HVIC 111 and the potential of the H-VDD terminal.

This shift to the negative-potential side (negative surge voltage) causes erroneous operation and latchup of the high-side circuit portion, and consequently there is the concern that the HVIC 111 may be destroyed. FIG. 12 is a circuit diagram showing in detail the level-shifting circuit of a conventional high-voltage integrated circuit device. FIG. 12(*a*) is the level-raising circuit diagram, and FIG. 12(*b*) is the level-lowering circuit diagram.

The level-raising circuit shown in FIG. 12(*a*) is provided with a level-shifting resistor 71, and an n-channel MOSFET 41 the drain of which is connected to the level-shifting resistor 71; the portion connecting the level-shifting resistor 71 and the n-channel MOSFET 41 is an output portion 101 of the level-raising circuit.

In order to prevent destruction of the level-shifting resistor 71 when the H-VDD potential goes to a much lower potential than GND potential (when an excessive negative surge voltage has been applied), a diode 75 is connected in parallel with the level-shifting resistor 71.

Further, the diode 75 functions to prevent the application of an excessive voltage to the gate of the MOSFET of the CMOS circuit of the high-side circuit portion when an overvoltage is applied to the H-VDD terminal. Normally a Zener diode is often used as this diode 75. Further, the n-channel MOSFET 41 incorporates a body diode 42 connected to be antiparallel.

On the other hand, the level-lowering circuit shown in FIG. 12(*b*) is provided with a drain of a p-channel MOSFET 43 and a level-shifting resistor 72 connected to the drain; the portion connecting the level-shifting resistor 72 and the p-channel MOSFET 43 being an output portion 102 of the level-lowering circuit.

In order to prevent destruction of the level-shifting resistor 72 when the H-VDD potential goes to a much lower potential than GND potential, a diode 76 is connected in parallel with the level-shifting resistor 72.

Further, the diode 76 functions to prevent the application of an excessive voltage to the gate of the MOSFET of the CMOS circuit of the low-side circuit portion when an overvoltage is applied to the H-VDD terminal while the MOSFET 43 is turned on. Further, the n-channel MOSFET 43 incorporates a body diode 44 connected to be antiparallel.

FIG. 13 is a cross-sectional view showing principal portions of the logic portion of the high-side circuit portion, the logic portion of the low-side circuit portion, and the level-raising circuit portion, of a self-isolated high-voltage integrated circuit device. In FIG. 13, an n⁻ region 2 and an n region 3, which are n-well regions, are formed in the surface layer of the p-type semiconductor substrate 1 connected to GND potential. In the n⁻ region 2 is formed, for example, a CMOS circuit or similar forming the logic portion of the low-side circuit portion 91. In the n region 3 is formed, for example, a CMOS circuit or similar forming the level-shifting circuit portion 94 and the logic portion of the high-side circuit portion 92.

The n-channel MOSFET 41 for level shifting (here, level raising) is formed of a p region 51 in contact with the n⁻ region 4 and serving as a base region, an n⁺ region 53 which is the source and p contact region 54 formed in the p region 51, an n⁺ region 52 which is the drain formed in the n⁻ region 4, and a gate electrode 55 formed between the n⁺ region 53 and the n⁺ region 52 on the p region 51 with a gate oxide film intervening.

In FIG. 13, the symbols 22 and 32 represent n⁺ regions, and the symbols 28 and 38 represent p⁺ regions. The symbol 56 represents a p⁺ region which is a first contact region, the symbol 62 represents an n⁺ region which is a second contact region, and the symbol 93 represents a high-voltage junction terminating region. The symbols 45 and 46 are pn diodes, and the symbols a to j are electrodes.

In FIG. 12 and FIG. 13, the n⁺ region 52 which is the drain of the n-channel MOSFET 41 is connected to the H-VDD terminal, via the level-shifting resistor 71, by surface metal wiring. Further, the portion connecting the n⁺ region 52 which is the drain and the level-shifting resistor 71 is the output portion 101 of the level-raising circuit. This output portion 101 outputs a low potential when the n-channel MOSFET 41 for level shifting is turned on, and outputs a high potential when the MOSFET 41 is turned off, and so can perform level-shifting operation which is signal transmission between different reference potentials.

In this way, a negative surge voltage $V_{SO}$ which is a negative potential relative to ground potential is applied to the Vs terminal with the timing at which the upper-arm IGBT 115 is turned off. This negative surge voltage $V_{SO}$ can be calculated using the following equation (1). In equation (1), L0 is the inductance value of the L load 118, and I is the value of the current flowing in the IGBT 115.

$$V_{SO} = L0 \times dI/dt \tag{1}$$

Further, when a negative surge voltage $V_{SO}$ is lower than GND potential (0 V)−($V_{spy}$+$V_{fd}$), the parasitic pn diodes 45 and 46 of the HVIC 111 (chip) begin to conduct. Here $V_{spy}$ is the battery voltage across the terminals of the high-side low-voltage power supply 113 or a bootstrap capacitor, not shown, and $V_{fd}$ is the forward-direction voltage drop across the parasitic pn diodes 45 and 46. When the absolute value of a negative surge voltage $V_{SO}$ is greatly increased in the negative direction, an overcurrent flows in the HVIC 111 (chip), and as a result erroneous operation of the high-side circuit portion tends to occur, and there is the concern that failure or destruction of the HVIC 111 (chip) may occur.

The applied negative surge voltage $V_{SO}$ is proportional to the product of the parasitic inductance component (L1) of the wiring on the printed circuit board and the cable up to the L load 118 and similar, and dI1/dt due to the turn-off interval of the on current I1 which had been flowing in the IGBT 115

(L1×(dl1/dt)); this spike-shape negative surge voltage $V_{SO}$ is applied to the Vs terminal. The applied voltage is approximately −100 V, and the applied interval is approximately several hundred nanoseconds to 1 μs.

As such a high-voltage integrated circuit, circuits to protect high-voltage integrated circuits which drive power transistors in a half-bridge configuration have been disclosed. Such a circuit is intended for use with circuits for which excessive negative swings at the output node are anticipated, and is a high-voltage integrated circuit chip having, between the circuit board and ground, a resistor which limits currents during negative voltage spikes. See, for example, Japanese Patent No. 3346763 (also referred to herein as "Patent Reference 1").

Further, as a high-voltage integrated circuit device, a driving device which diminishes the effect of reverse bias by inserting a diode between the drain electrode of a switching element belonging to a level shifter and the gate electrode of a MOS transistor belonging to an amplifier (CMOS circuit) has been disclosed. See, for example, Japanese Patent Application Laid-open No. 2001-25235 (also referred to herein as "Patent Reference 2").

Further, as another high-voltage integrated circuit device, a device in which the drain of a switching element belonging to a level shifter, a level-shifting resistor, and a current-limiting resistor are connected in series, and the section from the level-shifting resistor to the current-limiting resistor is taken to be the output portion of a level-raising circuit, has been disclosed. See, for example, Japanese Patent Application Laid-open No. 2008-301160 (also referred to herein as "Patent Reference 3").

Further, as another high-voltage integrated circuit device, the following device has been disclosed. Adjacent to a p well to form an n-channel MOSFET in CMOS logic among a high-side circuit portion formed of an n well formed on a p substrate, a $p^+$ impurity region is formed and is connected to a potential Vs. An $n^+$ impurity region and $p^+$ impurity region are similarly provided on an n well connected to an H-VDD potential. These impurity regions are formed on the periphery of the high-side CMOS logic, so that the hole current flowing from a ground potential region into the high-side n well region is absorbed before flowing into the p well, and parasitic thyristor latchup arising from a negative surge voltage can be avoided. See, for example, Japanese Patent Application Laid-open No. 2009-147378 (also referred to herein as "Patent Reference 4").

However, the above-described high-voltage integrated circuit devices of the prior art have the following problems. In the connection of a switching power device and an HVIC shown in FIG. 9, when the Vss voltage is approximately 1200 V and the H-VDD potential is approximately 20 V higher than the potential Vs, if the upper-arm IGBT 115 operates and the lower-arm IGBT 114 is turned off, current flows from the upper-arm IGBT 115 to the L load 118.

When, from this state, the upper-arm IGBT 115 is turned off, the L load 118 attempts to maintain the current, and so current flows from GND via the lower-arm FWD 116, the potential at the Vs terminal becomes lower than GND potential, and may reach approximately −100 V. When the potential at the Vs terminal reaches approximately −100 V, the potential at the H-VDD terminal is approximately −80 V.

In the structure of a high-voltage integrated circuit device shown in FIG. 13, the p semiconductor substrate 1 and the p region 61 are at GND potential. Hence when the potential at the Vs terminal is lowered until both the n region 3 which is an n well region and the $n^-$ region 4 which is an $n^-$ well region are lower than GND potential, both the parasitic pn diode 45 formed of the p semiconductor substrate 1 and the n region 3, and the parasitic pn diode 46 formed of the p region 61 and the $n^-$ region 4 are biased in the forward direction, and a large current flows.

Due to this large current, erroneous operation of the HVIC high-side circuit portion and low-side circuit portion may occur, and destruction due to latchup may occur. In this regard, the above-described Patent Reference 1 does not mention connection of a resistor which limits current between a ground terminal and the substrate, or connection at other places. Because this resistor is formed in a polysilicon layer, when a large pulse current (several Amperes to several tens of Amperes) due to a negative surge voltage flows transiently in a parasitic diode between the Vs terminal and the ground terminal, there is the concern that the polysilicon layer may be thermally decomposed by the overcurrent, leading to destruction of the HVIC.

Further, in the above-described Patent Reference 2, a diode is connected to diminish the effect of reverse biasing, and there is no mention of a resistor or layout method to limit the current in a body diode or parasitic diode when the H-VDD potential is at a more negative potential than the L load.

Further, in the above-described Patent Reference 3, it is proposed that by connecting a current-limiting resistor in the path between the high-potential side (H-VDD) and the low-potential side (ground) of the low-voltage power supply with reference voltage Vs of the level-shifting circuit, destruction by overcurrent of the body diode of an n-channel MOSFET and a parasitic diode themselves, and destruction by overcurrent at places in the level-shifting circuit at which the current capacity is small, are prevented. However, there is no mention of prevention of parasitic erroneous operation (erroneous inversion) of the Vs-reference high-side logic (CMOS circuit) or ground-reference low-side logic (CMOS circuit).

Further, in the above-described Patent Reference 4, it is stated that the $n^+$ and $p^+$ impurity regions in the high-side well region are fixed at H-VDD potential and VS potential to prevent parasitic erroneous operation of the Vs-reference high-side logic due to a negative surge voltage. However, there is no mention of prevention of erroneous operation of the logic portion of the low-side circuit portion.

FIG. 14 is an explanatory diagram showing erroneous operation of the low-side circuit portion and high-side circuit portion of a high-voltage integrated circuit device of the prior art. The cross-sectional configuration of the HVIC shown in FIG. 14 corresponds to the HVIC cross-sectional configuration shown in FIG. 13, and is the cross-sectional configuration of the low-side circuit portion 91, high-voltage junction terminating region (HVJT) 93, and high-side circuit portion 92. However, in FIG. 14, the level-raising circuit shown in FIG. 13 is omitted.

When a negative surge voltage is input to the H-VDD terminal via the Vs terminal, a forward-direction current flows in the parasitic pn diode 46. At this time, electrons, which are the minority carrier, are injected from the $n^-$ region 4 into the p region 61 which is the p anode region of the parasitic pn diode 46. The electrons flow into the $n^-$ region 2 with hardly any electrons being pulled out from the $p^+$ region 56 which is the first contact region formed in the p region 61, and flow toward the $n^+$ region 22, at a higher potential of for example approximately 15 V.

In this process, due to a parasitic resistance 78 existing in the $n^-$ region 2 which is an n well region in which the low-side circuit portion 91 is formed, the potential of the $n^-$ region 2 below the $p^+$ region 24 which is the drain of the p-channel MOSFET forming the logic portion of the low-side circuit portion 91 is pulled down by the voltage drop.

As a result, in the low-side circuit portion 91 also, a parasitic pnp bipolar transistor 79, which has as emitter the p$^+$ region 24 which is the drain of the p-channel MOSFET forming the logic portion, has as a base the n$^-$ region 2, and has as a collector the p semiconductor substrate 1, is turned on. Consequently, there is the concern that erroneous operation such as inversion of the output logic of the L-OUT terminal, and destruction resulting from latchup of the low-side circuit portion 91, may occur.

On the other hand, minority carrier holes which have entered into the n$^-$ region 4 flow into the p$^+$ regions 33 and 34 which are the source and drain of the p-channel MOSFET forming the logic portion of the high-side circuit portion 92, and flow into the p region 31 which is a p offset region. As a result, a parasitic npn transistor formed of the n$^+$ region 37 which is the source of the n-channel MOSFET, the p region 31 which is a p offset region, and the n region 3, is turned on, and there is the concern that erroneous operation of the logic portion of the high-side circuit portion 92 and destruction resulting from latchup may occur. In FIG. 14, the symbols 25, 29, 35 and 39 each indicate a gate electrode.

Thus, as described above, there are certain shortcomings in the related art.

SUMMARY OF THE INVENTION

Embodiments of the invention address these and other needs. To resolve the above-described problems of the prior art, certain embodiments provide a high-voltage integrated circuit device which can prevent erroneous operation and destruction of the low-side circuit portion (connected to a ground reference and internal power supply or L-VDD power supply when a negative voltage is applied to the H-VDD terminal or the Vs terminal).

Embodiments of a high-voltage integrated circuit device of this invention are provided as follows. On a semiconductor substrate of a first conduction type is disposed a low-side circuit portion of a second conduction type, connected to a low-voltage power supply which takes a GND potential as reference. On the semiconductor substrate, at a distance from the low-side circuit portion, is disposed a high-side circuit portion of the second conduction type, connected to a low-voltage power supply which takes, as reference, an intermediate potential higher than the GND potential. A region of the first conduction type is provided which is electrically connected to the GND potential, is disposed surrounding the high-side circuit portion, and forms a high-voltage junction terminating region together with an outer peripheral portion of the low-side circuit portion. In the first conduction type region, a first pickup electrode is disposed. A second pickup electrode connected to a high-potential side of the low-voltage power supply taking the intermediate potential as reference, is disposed on an inside of the high-voltage junction terminating region and in an outer peripheral portion of the high-side circuit portion. A first high-concentration contact region of the first conduction type is provided in Ohmic contact with the first pickup electrode. A second high-concentration contact region of the second conduction type is provided in Ohmic contact with the second pickup electrode. At least one region among the first high-concentration contact region and the second high-concentration contact region is a universal contact region, in which a p region and an n region are disposed in mutual alternating contact along a surface of the semiconductor substrate.

Further, embodiments of the invention provide a high-voltage integrated circuit device as follows. A first semiconductor region of a second conduction type, including a low-side circuit portion that is disposed on a semiconductor substrate of a first conduction type, is provided. A second semiconductor region of the second conduction type, including a high-side circuit portion that is disposed on the semiconductor substrate at a distance from the first semiconductor region, is provided. A first CMOS circuit is provided, which is formed of a first MOSFET having a source region of the first conduction type and a drain region of the first conduction type disposed in a surface layer of the first semiconductor region; a third semiconductor region of the first conduction type, disposed in the surface layer of the first semiconductor region at a distance from the first MOSFET; and a second MOSFET, having a source region of the second conduction type and a drain region of the second conduction type, disposed in a surface layer of the third semiconductor region. A second CMOS circuit is provided, which is formed of a third MOSFET having a source region of the first conduction type and a drain region of the first conduction type disposed in a surface layer of the second semiconductor region; a fourth semiconductor region of the first conduction type disposed in the surface layer of the second semiconductor region at a distance from the third MOSFET; and a fourth MOSFET having a source region of the second conduction type and a drain region of the second conduction type disposed in a surface layer of the fourth semiconductor region. A fifth semiconductor region of the first conduction type, which is disposed in a surface layer of the semiconductor substrate so as to surround the second semiconductor region and which has an impurity concentration higher than the semiconductor substrate, is provided. A first contact region of the first conduction type having an impurity concentration higher than the fifth semiconductor region is disposed in a surface layer of the fifth semiconductor region. A high-voltage junction terminating region is formed of the fifth semiconductor region and an outer peripheral portion of the second semiconductor region. A second contact region of the second conduction type having an impurity concentration higher than the second semiconductor region is disposed in the surface layer of the second semiconductor region and on the inside of the high-voltage junction terminating region. A third contact region of the second conduction type is disposed in the surface layer of the first semiconductor region and in contact with the source region of the first MOSFET. A fourth contact region of the first conduction type is disposed in the surface layer of the third semiconductor region and in contact with the source region of the second MOSFET. A fifth contact region of the second conduction type is disposed in the surface layer of the second semiconductor region and in contact with the source region of the third MOSFET. A sixth contact region of the first conduction type is disposed in the surface layer of the fourth semiconductor region and in contact with the source region of the fourth MOSFET. A first pickup electrode in Ohmic contact with the first contact region is disposed on the first contact region. A second pickup electrode in Ohmic contact with the second contact region is disposed on the second contact region. A first source electrode is provided in contact with the source region of the first MOSFET and the third contact region. A first drain electrode is provided in contact with the drain region of the first MOSFET. A second source electrode is provided in contact with the source region of the second MOSFET and the fourth contact region. A second drain electrode is provided in contact with the drain region of the second MOSFET. A third source electrode is provided in contact with the source region of the third MOSFET and the fifth contact region. A third drain electrode is provided in contact with the drain region of the third MOSFET. A fourth source electrode is provided in contact with the source region of the fourth MOSFET and the sixth contact region. A fourth drain electrode is provided in contact with the drain region of the fourth MOSFET. The second source electrode and the first pickup electrode are connected to a GND terminal. The third source electrode and the second pickup electrode are connected to a high-potential side terminal. At least one region among the first contact region and the second contact region is a universal contact region, in which a p region and an n region are disposed in mutual alternating contact along a surface of the semiconductor substrate.

Further, in a high-voltage integrated circuit device in accordance with embodiments of the invention, one of the regions among the p region and the n region forming the universal contact region is surrounded by the other region.

Further, in a high-voltage integrated circuit device in accordance with embodiments of the invention, the planar shapes of the p region and the n region forming the universal contact region are both strip shapes.

Further, in a high-voltage integrated circuit device in accordance with embodiments of the invention, among the p region and the n region forming the universal contact region, the depth of the region of conduction type different from the conduction type of the first conduction type region is equal to or greater than the depth of the first conduction type region.

Further, a high-voltage integrated circuit device in accordance with embodiments of the invention, among the p region and the n region forming the universal contact region, the depth of the region of conduction type different from the conduction type of the fifth semiconductor region is equal to or greater than the depth of the fifth semiconductor region.

Further, a high-voltage integrated circuit device in accordance with embodiments of the invention, the high-side circuit portion is a circuit portion, which is connected to a power supply taking, as a reference potential, a connection point between a switching element of an upper arm and a switching element of a lower arm that form a half-bridge circuit, and which drives the switching element of the upper arm. Further, the high-potential side terminal is connected to a high-potential side of the power supply. The GND terminal is connected to the GND potential.

By way of embodiments of the invention, by making a pickup region of the regions fixed at GND potential outside a high-voltage junction terminating region surrounding the high-side circuit portion a universal contact region, the quantity of carriers flowing into the low-side circuit portion can be reduced, and destruction resulting from erroneous operation and latchup of the logic portion of the low-side circuit portion can be prevented.

Further, by way of embodiments of the invention, by making a pickup region of the regions fixed at the potential of the high-potential side of the power supply of the high-side circuit portion, disposed in the outer peripheral portion of the high-side circuit portion, a universal contact region, the quantity of carriers flowing into the low-side circuit portion can be reduced, and destruction resulting from erroneous operation and latchup of the logic portion of the low-side circuit portion can be prevented.

By way of embodiments of the invention, there is the advantageous result that erroneous operation and destruction of the low-side circuit portion can be prevented.

DETAILED DESCRIPTION

Below, certain aspects of a high-voltage integrated circuit device of embodiments of the invention are explained in detail, referring to the attached drawings. In the following explanations of embodiments and attached drawings, similar constituent members are assigned the same symbols, and redundant explanations are omitted. Further, the same sites as in a conventional structure are assigned the same symbols.

Embodiment 1

Figure 1:
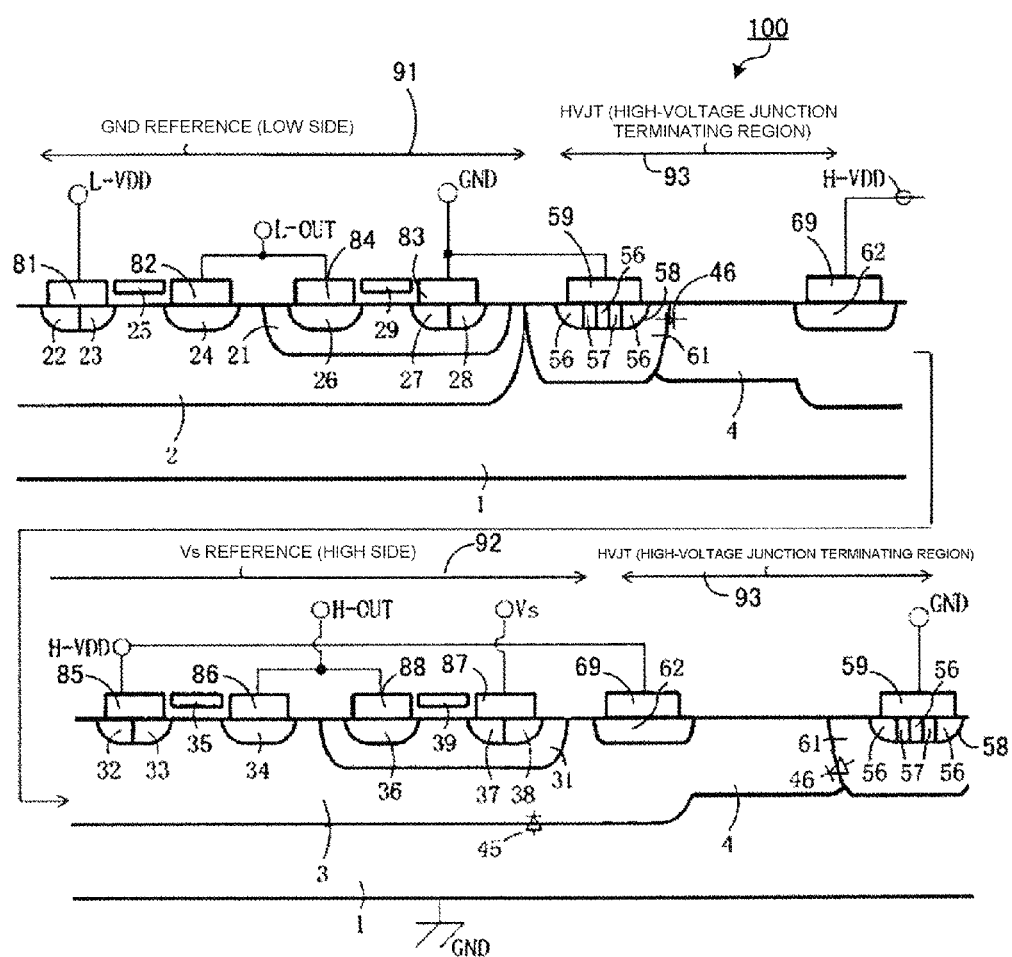
FIG. 1 is a cross-sectional view showing principal portions of the high-voltage integrated circuit device of Embodiment 1 of the invention.

FIG. 1 is a cross-sectional view showing principal portions of the high-voltage integrated circuit device of Embodiment 1 of the invention. In the high-voltage integrated circuit device 100 shown in FIG. 1, on one of the main faces (hereafter called the surface layer) within a p semiconductor substrate 1 are formed an n region 3 which becomes an n well region, which is a high-side floating potential region; an $n^-$ region 4, which becomes a high-voltage junction terminating region 93; and an n⁻ region 2 forming a low-side L-VDD potential region.

Figure 9:
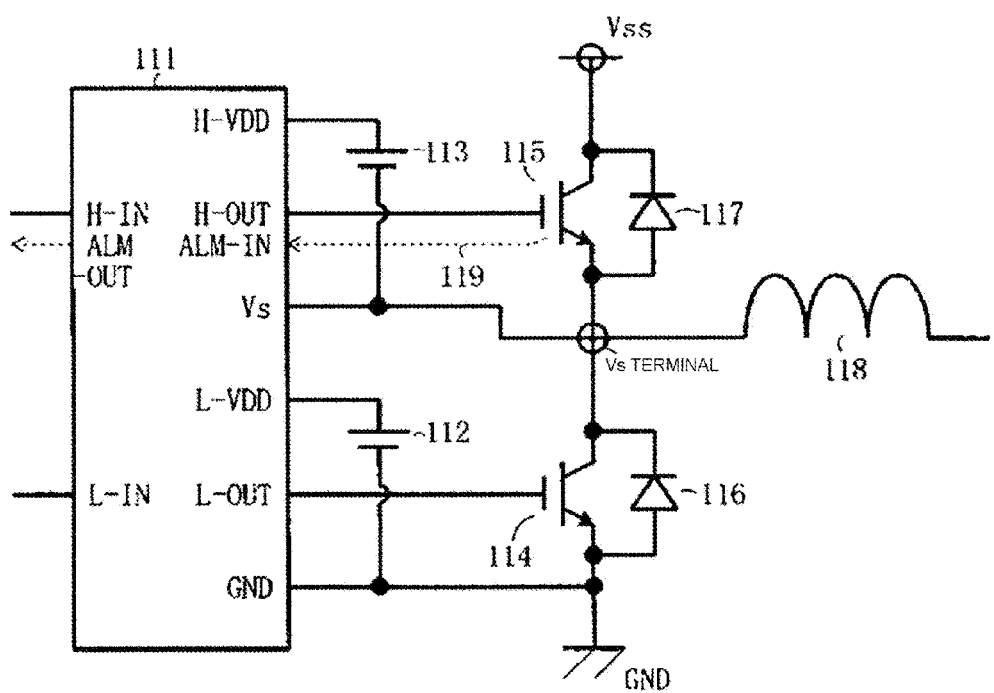
FIG. 9 is an explanatory diagram showing an example of connection of a switching power device forming an inverter or other power conversion device and a conventional HVIC driving same.
Figure 10:
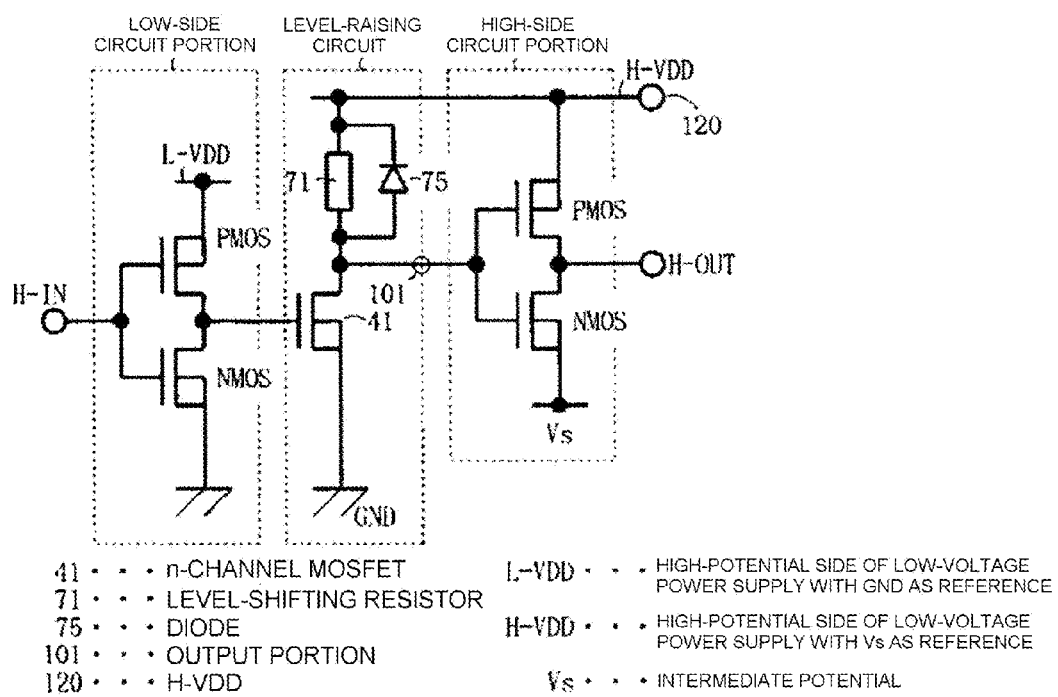
FIG. 10 is a circuit diagram showing a level-raising circuit and a peripheral circuit thereof.

This high-voltage integrated circuit device 100 corresponds to the HVIC 111 which is the driving element shown in FIG. 9, and in particular, corresponds to the low-side circuit portion and high-side circuit portion shown in FIG. 10 controlling the upper-arm IGBT 115 of a half bridge. In FIG. 1, the level-raising circuit is omitted. The level-lowering circuit shown in FIG. 11 can be provided, as necessary, in the high-voltage integrated circuit device 100.

Figure 11:
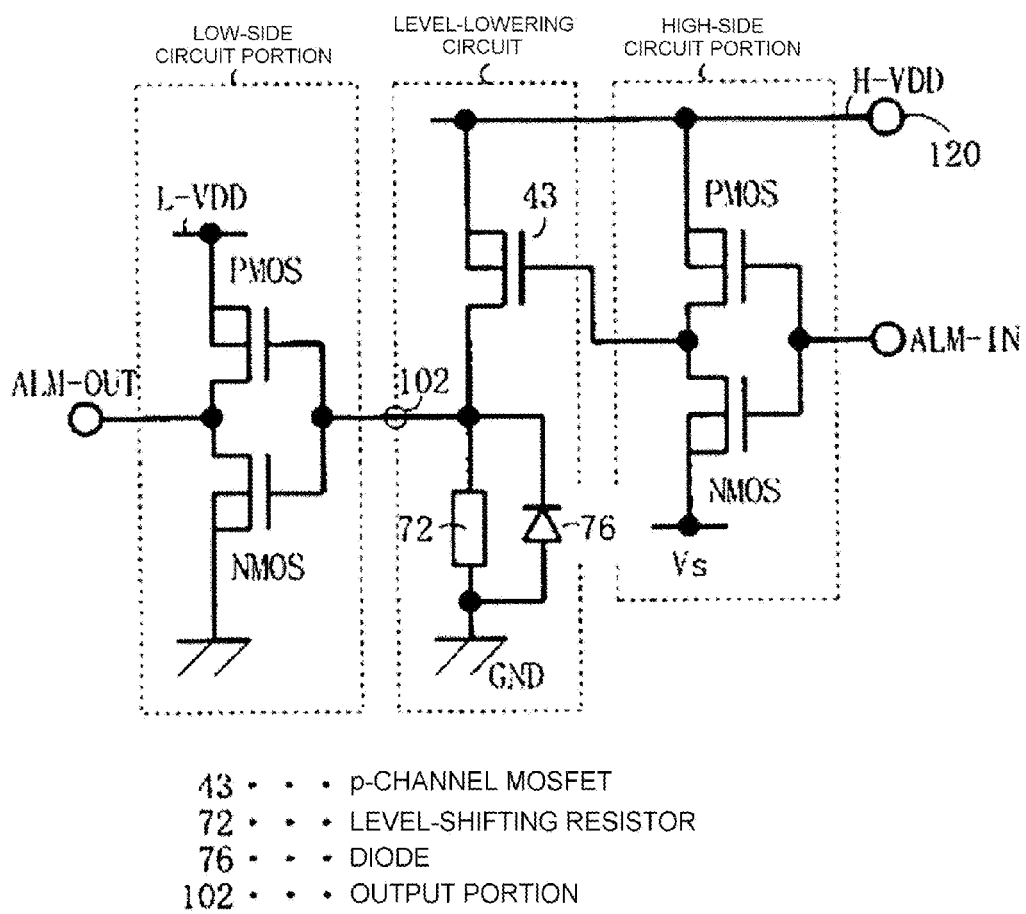
FIG. 11 is a circuit diagram showing a level-lowering circuit and a peripheral circuit thereof.
Figure 12:
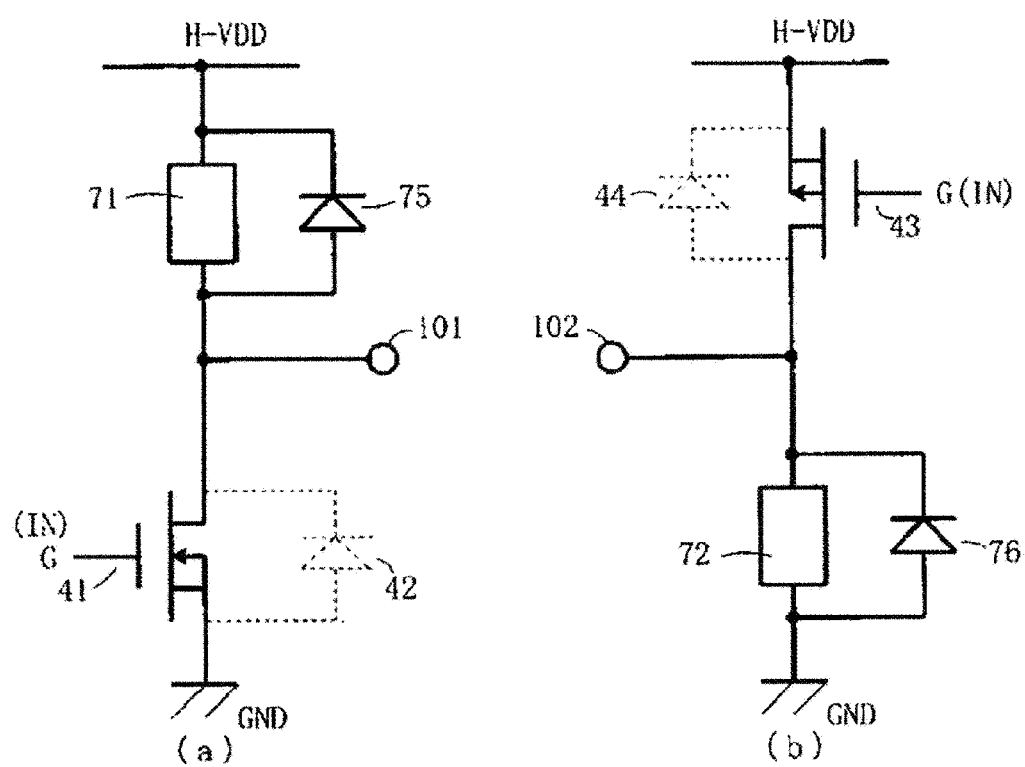
FIG. 12 is a circuit diagram showing in detail the level-shifting circuit of a high-voltage integrated circuit device of the prior art.
Figure 13:
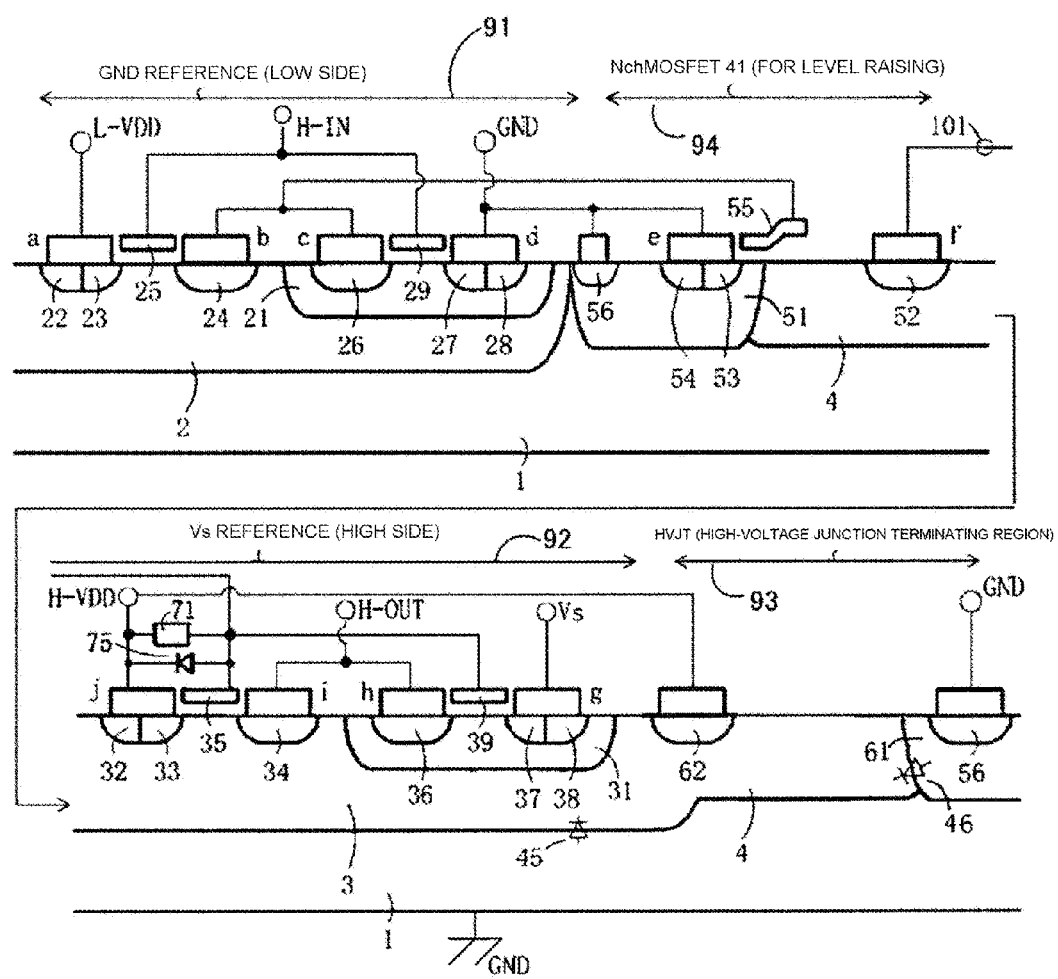
FIG. 13 is a cross-sectional view showing principal portions of the logic portion of the high-side circuit portion, logic portion of the low-side circuit portion, and level-raising circuit portion of a self-isolated high-voltage integrated circuit device.

In this n region 3 which is a high-side floating potential region is formed a high-side circuit 92 connected to a low-voltage power supply which takes as reference an intermediate potential Vs, as shown in FIG. 10 and FIG. 11. In the n⁻ region 2 of the low-side L-VDD potential region is formed a low-side circuit portion 91 connected to a low-voltage power supply with GND reference, as shown in FIG. 10 and FIG. 11.

Further, a p region 61 is formed so as to surround the n⁻ region 4 and be in contact with the n region 3. In the surface layer of this p region 61, a first universal contact region 58 is formed in which p⁺ regions 56 and n⁺ regions 57 are disposed in mutual alternating contact along the surface of the p semiconductor substrate 1. The p region 61 is a fixed-potential region to fix the potential of the p semiconductor substrate 1 at GND potential. The impurity concentration in the p region 61 is higher than the impurity concentration in the p semiconductor substrate 1, and is lower than the impurity concentration in the p⁺ region 56. The first universal contact region 58 is in Ohmic contact with a first pickup electrode 59 in contact with the GND terminal. A first universal contact structure is formed by the first pickup electrode 59 and the first universal contact region 58.

In the surface layer of the n region 3 is formed an n⁺ region 62 which is a contact region. On this n⁺ region 62 is formed a second pickup electrode 69 in Ohmic contact. The n⁺ region 62 is a fixed-potential region to fix the potential at the high-side potential of the power supply of the high-side circuit portion which takes the intermediate potential Vs as a reference potential. The impurity concentration in the n⁺ region 62 is higher than the impurity concentration in the n region 3. When a voltage is applied across the first pickup electrode 59 and the second pickup electrode 69, the region of formation of a depletion layer extending to the p region 61 and n⁻ region 4 becomes a high-voltage junction terminating region 93 (HVJT).

The high-voltage junction terminating region 93 surrounds the periphery of the n region 3, and the n⁻ region 2 is disposed on the outside thereof. The low-side circuit portion 91 is provided with a first CMOS circuit formed of a first p-channel MOSFET and a first n-channel MOSFET. The first p-channel MOSFET has a p⁺ region 23 (source), a p⁺ region 24 (drain), a first source electrode 81 and a first drain electrode 82. The first source electrode 81 is in Ohmic contact with the p⁺ region 23. The first drain electrode 82 is in Ohmic contact with the p⁺ region 24. The first n-channel MOSFET has an n⁺ region 27 (source), an n⁺ region 26 (drain), a second source electrode 83 and a second drain electrode 84. The second source electrode 83 is in Ohmic contact with the n⁺ region 27. The second drain electrode 84 is in Ohmic contact with the n⁺ region 26.

The high-side circuit portion 92 is provided with a second CMOS circuit formed of a second p-channel MOSFET and a second n-channel MOSFET. The second p-channel MOSFET has a p⁺ region 33 (source), a p⁺ region 34 (drain), a third source electrode 85 and a third drain electrode 86. The third source electrode 85 is in Ohmic contact with the p⁺ region 33. The third drain electrode 86 is in Ohmic contact with the p⁺ region 34. The second n-channel MOSFET has an n⁺ region 37 (source), an n⁺ region 36 (drain), a fourth source electrode 87 and a fourth drain electrode 88. The fourth source electrode 87 is in Ohmic contact with the n⁺ region 37. The fourth drain electrode 88 is in Ohmic contact with the n⁺ region 36.

The n⁺ region 22, p⁺ region 28, n⁺ region 32 and p⁺ region 38 are contact regions, and are in Ohmic contact, respectively, with the first source electrode 81, second source electrode 83, third source electrode 85 and fourth source electrode 87.

The first pickup electrode 59 is connected to the second source electrode 83, and is connected to the GND terminal. The second pickup electrode 69 is connected to the third source electrode 85, and is connected to the H-VDD terminal. This first pickup electrode 59 is disposed on the side of the low-side circuit portion 91 from the high-voltage junction terminating region 93. The second pickup electrode 69 is disposed on the side of the high-side circuit portion 92 from the high-voltage junction terminating region 93.

The first drain electrode 82 and second drain electrode 84 are connected together, and are further connected to the L-OUT terminal. The third drain electrode 86 and fourth drain electrode 88 are connected together, and are connected to the H-OUT terminal. The fourth source electrode 87 is connected to the Vs terminal. In FIG. 1, 45 is a parasitic pn diode formed by the p semiconductor substrate 1 and the n region 3.

The n⁻ regions 2 and 4, n region 3 and p region 61 pass through patterning processes and are ion-implanted with phosphorus or boron impurities, after which, for example, a high-temperature (approximately 1100 to 1200° C.) diffusion process is performed to cause diffusion to a prescribed diffusion depth, to form well regions.

Further, in the surface layer of the n⁻ region 2, which is an L-VDD potential region in which the low-side circuit portion 91 is formed, a p offset region (p region 21), which is a base region, is formed. In the p region 21 is formed a first n-channel MOSFET. This p region 21 passes through a patterning process and is ion-planted with boron impurities, after which diffusion is induced to a prescribed diffusion depth by a diffusion process different from the above-described high-temperature (approximately 1100 to 1200° C.) diffusion process used to form the n⁻ regions 2 and 4, n region 3 and p region 61.

The n⁺ region 62, which is a contact region to obtain Ohmic contact with the H-VDD terminal, is formed to a prescribed depth by for example ion implantation of arsenic so as to obtain a surface concentration of approximately $1 \times 10^{20}/cm^3$, and then annealing at for example approximately 750 to 900° C.

Further, the n⁺ region 22 made to be in Ohmic contact with the L-VDD terminal, and the n⁺ regions 27 and 26 of the source and drain of the first n-channel MOSFET forming the low-side circuit portion 91, are also formed by ion implantation and annealing, similarly to the n⁺ region 62. That is, after passing through a patterning process for n⁺ region formation, for example arsenic is ion-implanted to obtain a surface concentration of approximately $1 \times 10^{20}/cm^3$. Further, the p⁺ regions 23 and 24 which are the source and drain of the first p-channel MOSFET forming the low-side circuit portion 91, and the p⁺ region 28 which is a contact region, are also formed by passing through a patterning process for p⁺ region formation, and for example ion-implanting $BF_2$ to obtain a surface concentration of approximately $1 \times 10^{20}/cm^3$. Thereafter, by for example the same annealing process at approximately 750 to 900° C., the p⁺ regions 23, 24 and 28 are formed to the prescribed diffusion depths.

In the surface layer of the n region 3 which is a high-side floating potential region in which the high-side circuit portion 92 is formed, a p offset region (p region 31) which is a base region is formed. In the p region 31 is formed a second n-channel MOSFET. This p region 31 is formed, for example, similarly to the p region 21. The n⁺ region 32 for Ohmic contact with the H-VDD terminal, and the n⁺ regions 37 and 36 of the source and drain of the second n-channel MOSFET forming the high-side circuit portion 92, are formed similarly to the n⁺ regions 22, 27 and 26. The p⁺ regions 33 and 34 which are the source and drain of the second p-channel MOSFET forming the high-side circuit portion 92, and the p⁺ region 38 which is a contact region, are formed similarly to the p⁺ regions 23, 24 and 28.

Figure 2:
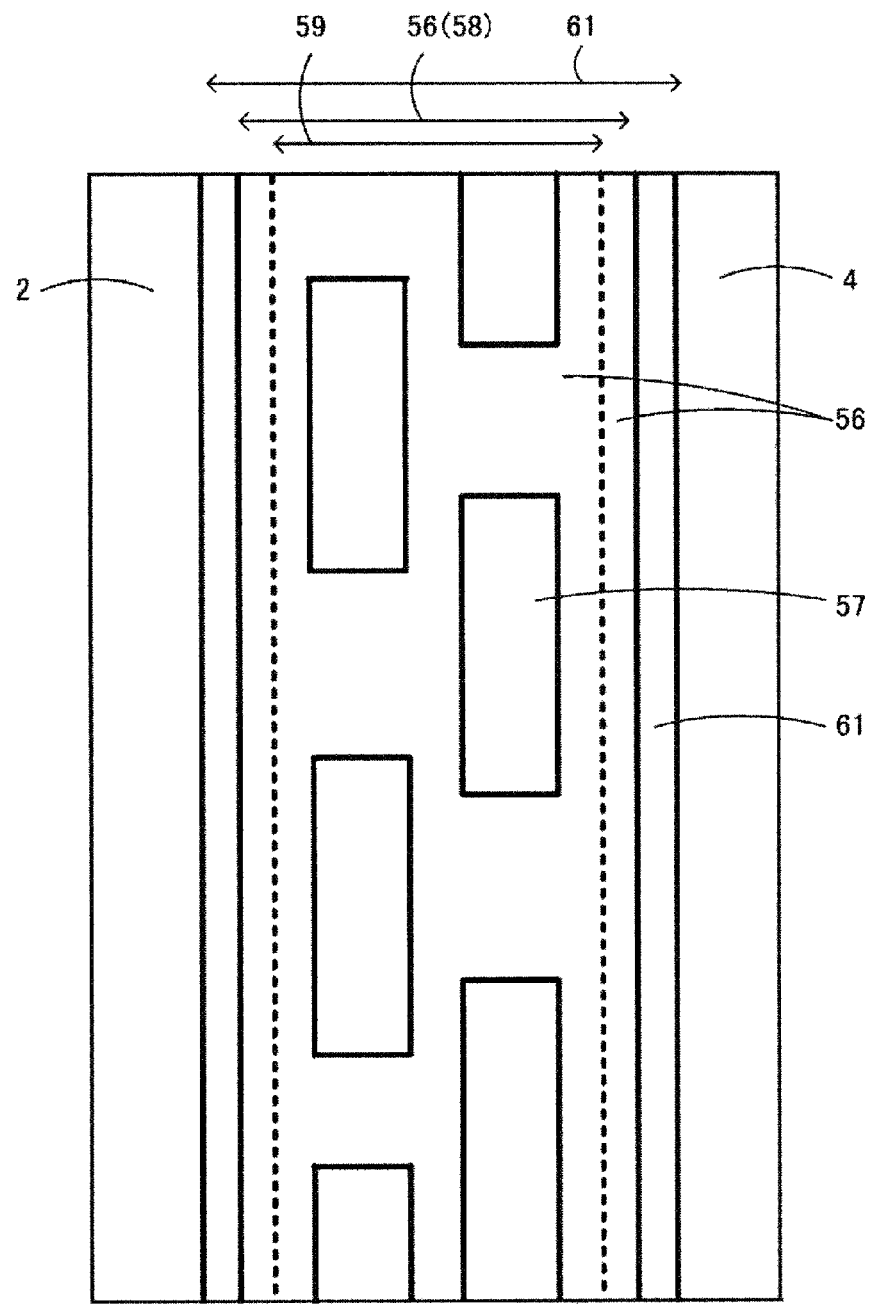
FIG. 2 is a plane view showing the planar pattern of the first universal contact region.

FIG. 2 is a plane view showing the planar pattern of the first universal contact region shown in FIG. 1. In FIG. 2, a planar pattern of the first universal contact region 58 formed in the surface layer of the p region 61 is shown. The first universal contact region 58 is formed of a p⁺ region 56 and n⁺ regions 57 formed in the surface layer of the p region 61 that forms the parasitic pn diode 46. The p⁺ region 56 and n⁺ regions 57 are contact regions, and are formed so as to be in mutual contact. The p⁺ region 56 and n⁺ regions 57 are each formed using separate ion implantation masks. For example, after forming the p⁺ region 56, the n⁺ regions 57 may be selectively formed from the surface of the p⁺ region 56 to a depth greater than that of the p⁺ region 56. On this first universal contact region 58, a metal electrode which is the first pickup electrode 59 is brought into Ohmic contact, to form the first universal contact structure.

By employing this first universal contact structure, when a negative surge voltage is applied to the H-VDD terminal via the Vs terminal, the minority carrier electrons flowing in the parasitic pn diode 46 can be rapidly pulled from the first pickup electrode 59. As a result, the quantity of electrons flowing into the n⁻ region 2 can be suppressed, and erroneous operation and destruction due to latchup of the logic portion of the low-side circuit portion 91 can be prevented.

Further, the quantity of minority carrier holes flowing in this parasitic pn diode 46 which are injected into the n⁻ region 4 can be reduced, so that erroneous operation and destruction due to latchup of the logic portion of the high-side circuit portion 92 can be prevented.

In FIG. 2, the first universal contact region 58 is shown having a rectangular planar shape so as to surround the p⁺ region 56, and with numerous n⁺ regions 57 disposed in island form. In an interval in which a negative surge voltage is applied to the Vs terminal, in order to enhance the effect of pulling out electrons in the p region 61 of the parasitic pn diode 46 (high-voltage diode) of the HVJT, it is desirable that the fraction of the n⁺ regions 57 compared with the p⁺ region 56 be increased, or that an n offset region, described below in Embodiment 4, be formed. However, when ESD (Electrostatic Discharge) or another positive surge is input from the H-VDD terminal to the N⁺ region 62, the parasitic pn diode 46 of the HVJT enters a reverse-biased state, and avalanche breakdown occurs. At this time, holes occurring due to the avalanche breakdown flow into the p region 61. These holes are captured in the p⁺ region 56 of the first universal contact region 58 of the p region 61. When the n⁺ regions 57 are disposed as twofold and threefold line shapes surrounding the high-side circuit portion 92, the resistance (base resistance) in the p region 61 directly below this n⁺ region 57 increases. Consequently, when a voltage drop of 0.6 V occurs in the p region 61 directly below the n⁺ regions 57, there is the concern that a parasitic npn bipolar transistor formed of the n⁻ region 4, the p region 61 and the n⁺ regions 57 may operate, resulting in current destruction. In order to suppress such parasitic operation, it is desirable that the n⁺ regions 57 be disposed not in a line shape, but in shortly divided island form, so as to overlap two or more times (in the example in FIG. 2, in a dually-overlapping structure) so that there is overlapping in alternation from the n⁺ region 62 (H-VDD terminal) to the p region 61. Through such disposition, holes can be absorbed even in the p⁺ region 56 which is enclosed between n⁺ regions 57, so that increases in local base resistance can be suppressed, and operation of the parasitic npn bipolar transistor can be suppressed. Similarly, it is desirable that the n⁺ regions 57 be formed so as to surround the p region 61. As the planar pattern of the first universal contact region 58, there are also cases in which the planar shapes of the n⁺ regions 57 disposed in island form may be circular, square, or polygonal. Further, there are also cases in which p⁺ regions 56 and n⁺ regions 57 are formed in bands (for example in stripe shapes).

This first universal contact region 58 passes through a patterning process using the planar pattern shown in FIG. 2, and for example $BF_2$ is ion-implanted into the p⁺ region 56 using a separate ion implantation mask until the surface concentration is approximately $1 \times 10^{20}/cm^3$. Then, for example arsenic is ion-implanted into the n⁺ regions 57 using a separate ion implantation mask until the surface concentration is approximately $1 \times 10^{20}/cm^3$. Thereafter, for example the same annealing process at approximately 750° C. to 900° C. as described above is performed, to form the p⁺ region 56 and n⁺ regions 57 to diffusion depths of approximately 0.2 μm to 0.5 μm. In this case, separate ion implantation masks are used for each, so that one impurity type is not compensated by the other impurity type.

Thereafter, after forming the GND terminal, H-VDD terminal, L-VDD terminal, electrodes of the logic portion (MOSFET) of the low-side circuit portion 91, and similar, a surface protective film is formed, and a high-voltage integrated circuit device 100 having a low-side circuit portion 91, high-side circuit portion 92 and high-voltage junction terminating region 93 is completed.

As shown in FIG. 1, by disposing the first universal contact region 58 below the first pickup electrode 59 connected to the GND electrode, when a negative surge voltage is input to the H-VDD terminal via the Vs terminal, the quantity of electrons flowing into the logic portion (n⁻ region 2) of the low-side circuit portion 91 can be reduced.

Figure 3:
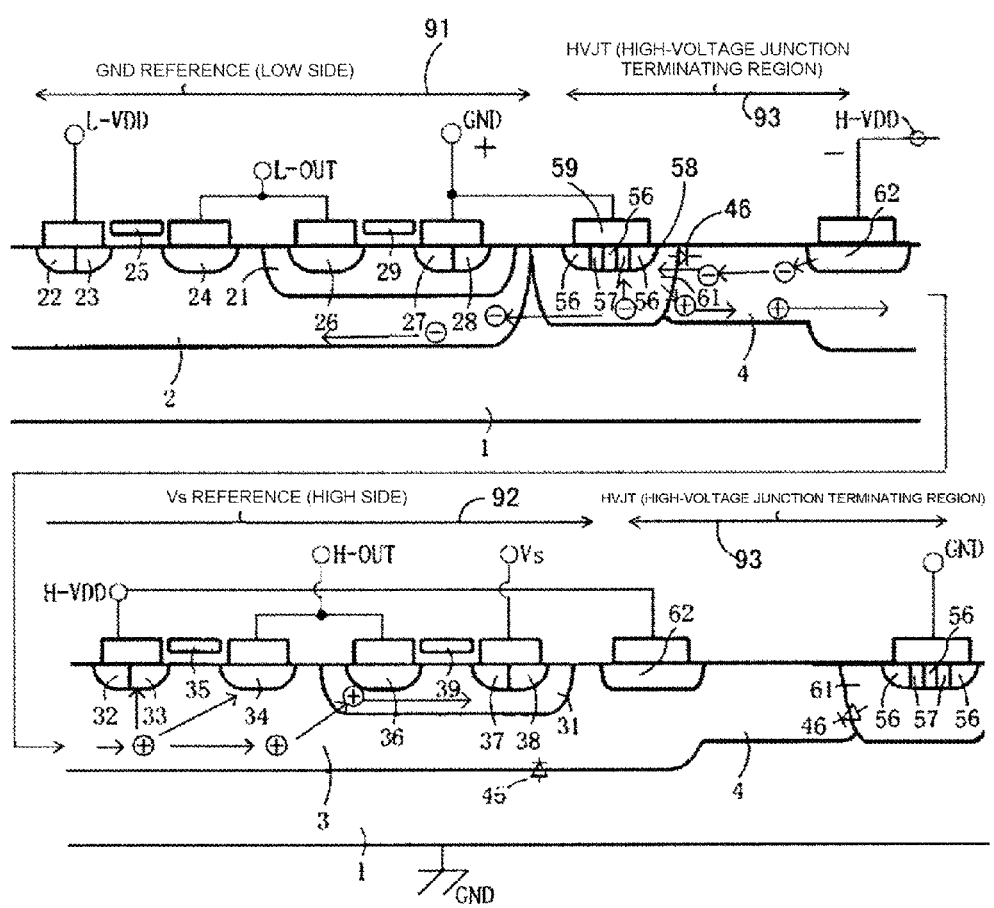
FIG. 3 is an explanatory diagram showing the behavior of electrons and holes when a negative surge voltage is applied via the H-VDD terminal.

FIG. 3 is an explanatory diagram showing the behavior of electrons and holes when a negative surge voltage is applied via the H-VDD terminal. Electrons are injected as minority carriers from the n⁻ region 4 into the p region 61 of the parasitic pn diode 46 formed of the p region 61 and the n⁻ region 4, and electrons pass through this p region 61 to flow into the n⁻ region 2. At this time, a portion of the electrons entering the p region 61, which is midway in the path of movement of electrons flowing from the n⁻ region 4 toward the n⁻ region 2, are trapped by the n⁺ regions 57, the junction barrier of which is higher (approximately 0.6 V higher) than this p region 61, that is, which has a low electron energy barrier, and are pulled into the first pickup electrode 59.

Hence the quantity of electrons flowing into the n⁻ region 2 decreases, and erroneous operation and destruction due to latchup of the logic portion of the low-side circuit portion 91 can be prevented. On the other hand, the quantity of holes emitted from the p⁺ region 56 of the first universal contact region 58 into the p region 61 is suppressed because of the n⁺ regions 57 adjacent to the p⁺ region 56. Consequently the quantity of holes injected from the p region 61 into the n⁻ region 4 of the parasitic pn diode 46 is also reduced, and erroneous operation and destruction due to latchup of the logic portion of the high-side circuit portion 92 can be prevented.

Figure 14:
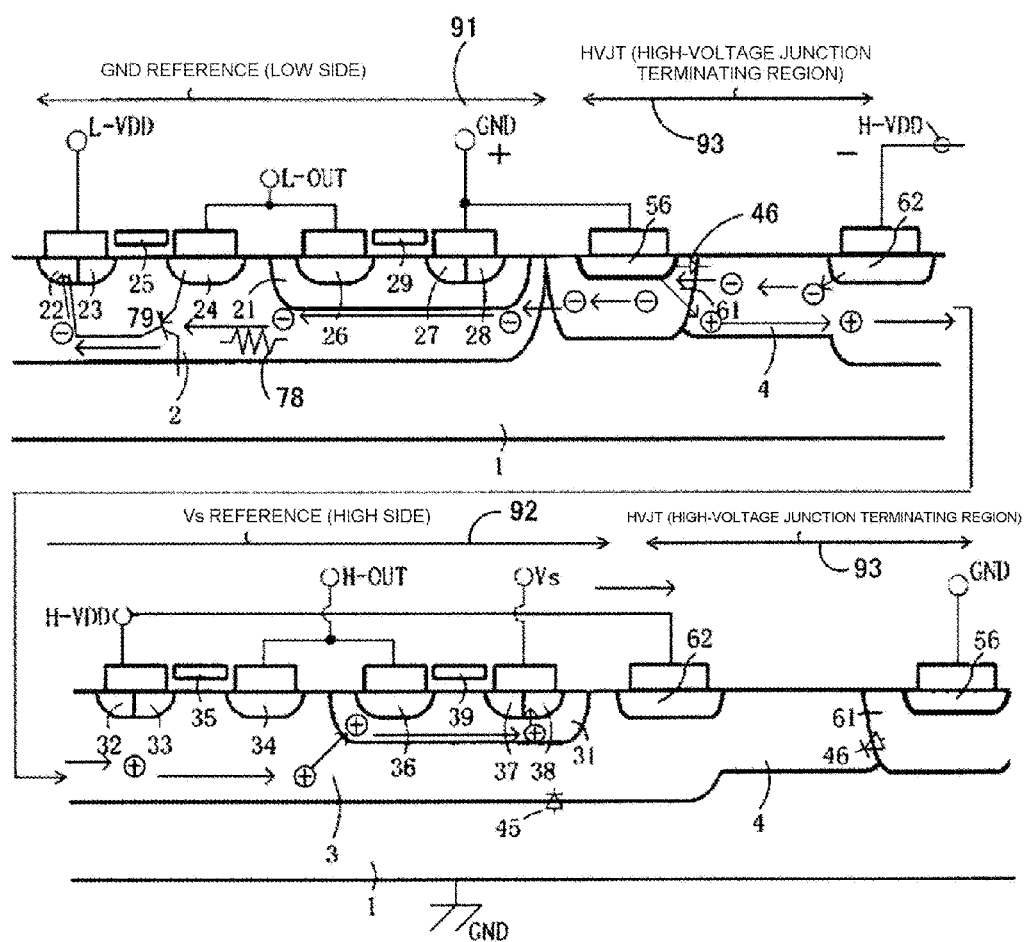
FIG. 14 is an explanatory diagram showing erroneous operation of the low-side circuit portion and high-side circuit portion of a high-voltage integrated circuit device of the prior art.

The area necessary to form the first universal contact region 58 is the same as the area of the p$^+$ region 56 which is the first contact region of the prior art shown in FIG. 14. Hence there is no increase in chip size and no increase in manufacturing costs.

Figure 15:
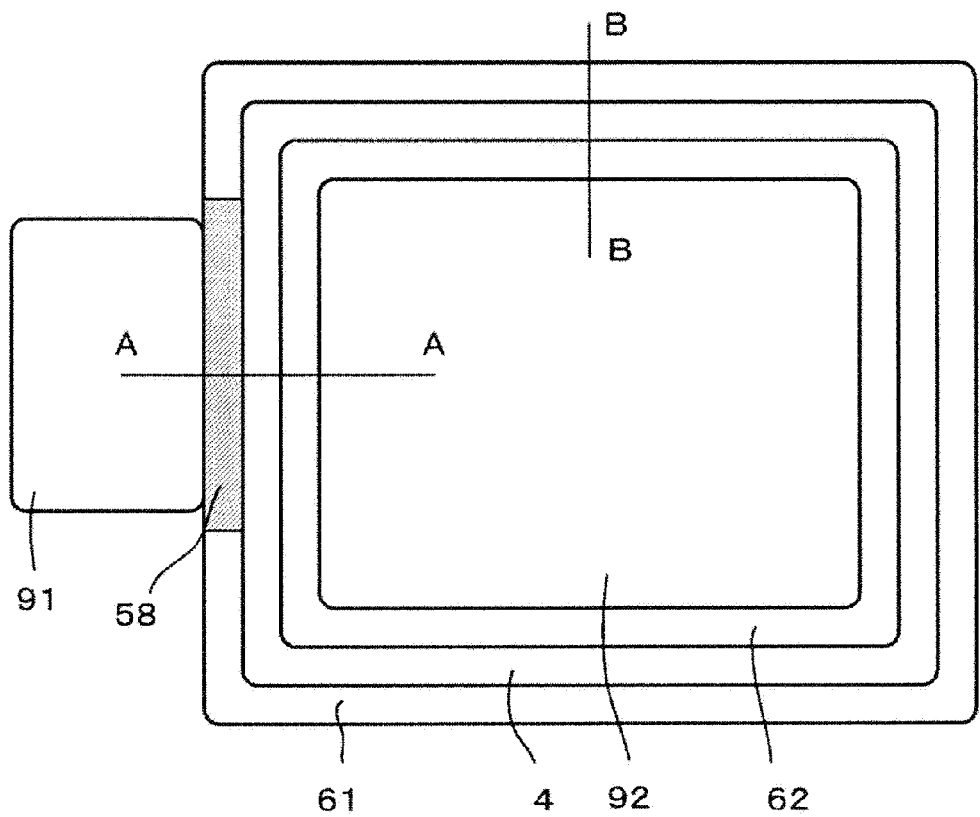
FIG. 15 is a plane view showing an example of the planar structure of principal portions of a high-voltage integrated circuit device of this invention.

FIG. 15 is a plane view showing an example of the planar structure of principal portions of a high-voltage integrated circuit device of this invention. In FIG. 15, the cross-sectional structure in the section A-A corresponds to the cross-sectional view shown in FIG. 1. The cross-sectional structure in the section B-B corresponds to the cross-sectional view shown in FIG. 14. An advantageous result is obtained even when the first universal contact region 58 is formed only in the surface layer of the p region 61 at the place opposing the low-side circuit portion 91, without forming the first universal contact region 58 along the entire periphery of the p region 61. Further, it is preferable that the first universal contact region 58 be formed along the entire periphery of the p region 61. In the high-voltage integrated circuit devices of the following Embodiments 2 to 4 also, a first universal contact region 58 is similarly formed in the planar layout.

Further, in FIG. 15 the n$^+$ region 62 which is the second contact region is formed along the entire periphery so as to surround the high-side circuit portion 92, but formation along the entire periphery is not necessary. When the distance between the CMOS circuit of the high-side circuit portion 92 and the high-voltage junction terminating region is short, it is desirable that the n$^+$ region 62 be provided at least between the CMOS circuit of the high-side circuit portion 92 and the high-voltage junction terminating region. In the high-voltage integrated circuit devices of Embodiments 2 to 4 below, the n$^+$ region 62 is formed in a similar planar layout.

Figure 16:
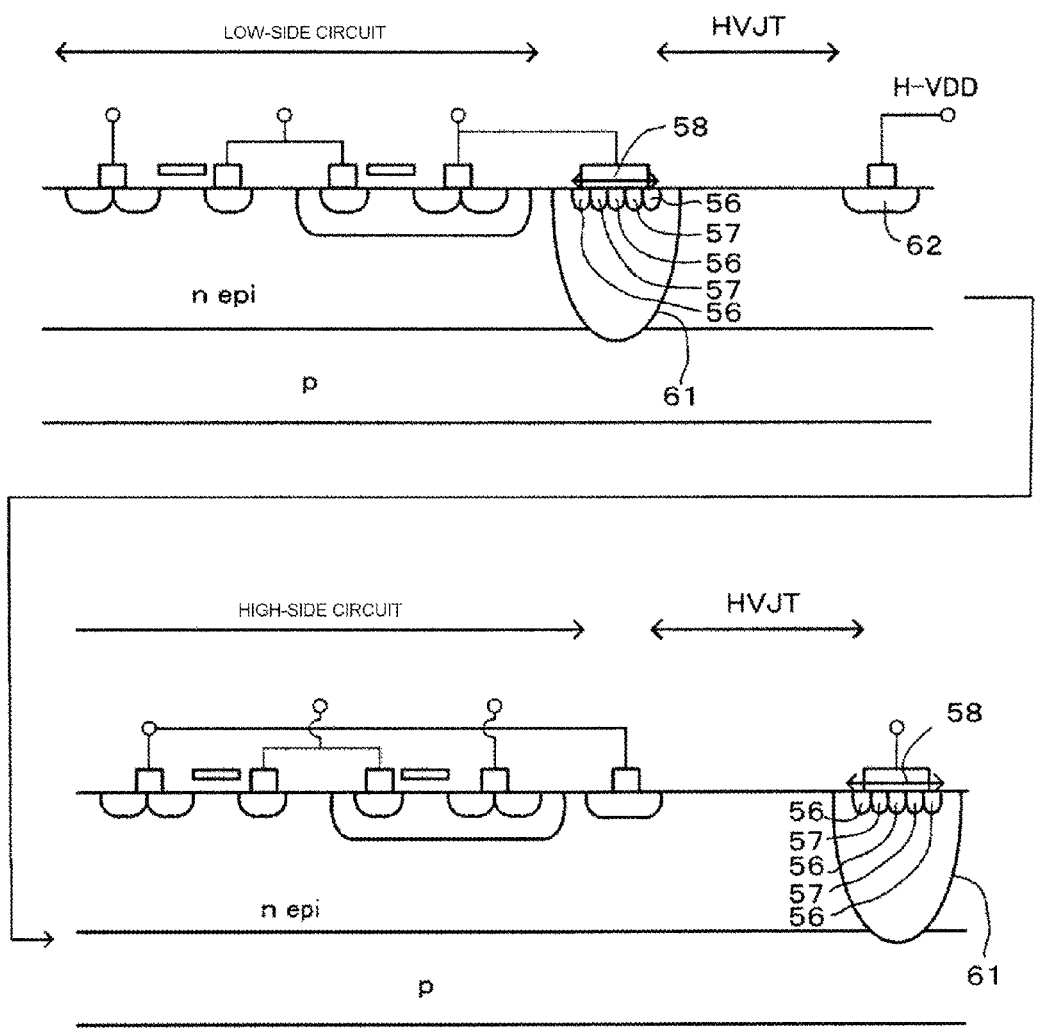
FIG. 16 is a cross-sectional view showing another example of principal portions of a high-voltage integrated circuit device of this invention.

FIG. 16 is a cross-sectional view showing another example of principal portions of a high-voltage integrated circuit device of this invention. The high-voltage integrated circuit device 100 shown in FIG. 16 is fabricated using an epitaxial substrate in which an n epitaxial growth layer (n epi) is formed on a p supporting substrate. On the epitaxial substrate is formed a p region 61 penetrating the n epitaxial growth layer and reaching the p supporting substrate, and in the surface layer thereof is formed a first universal contact region 58 that is formed of p$^+$ regions 56 and n$^+$ regions 57. The high-voltage integrated circuit devices of Embodiments 2 to 4 below also may similarly be fabricated using an epitaxial substrate.

As explained above, in Embodiment 1, by forming a first universal contact region 58 as a pickup region fixed to GND potential on the outside of the high-voltage junction terminating region 93 surrounding the high-side circuit portion 92, the quantity of carriers flowing into the low-side circuit portion 91 can be reduced, and erroneous operation and destruction due to latchup of the logic portion of the low-side circuit portion 91 can be prevented.

Embodiment 2

Figure 4:
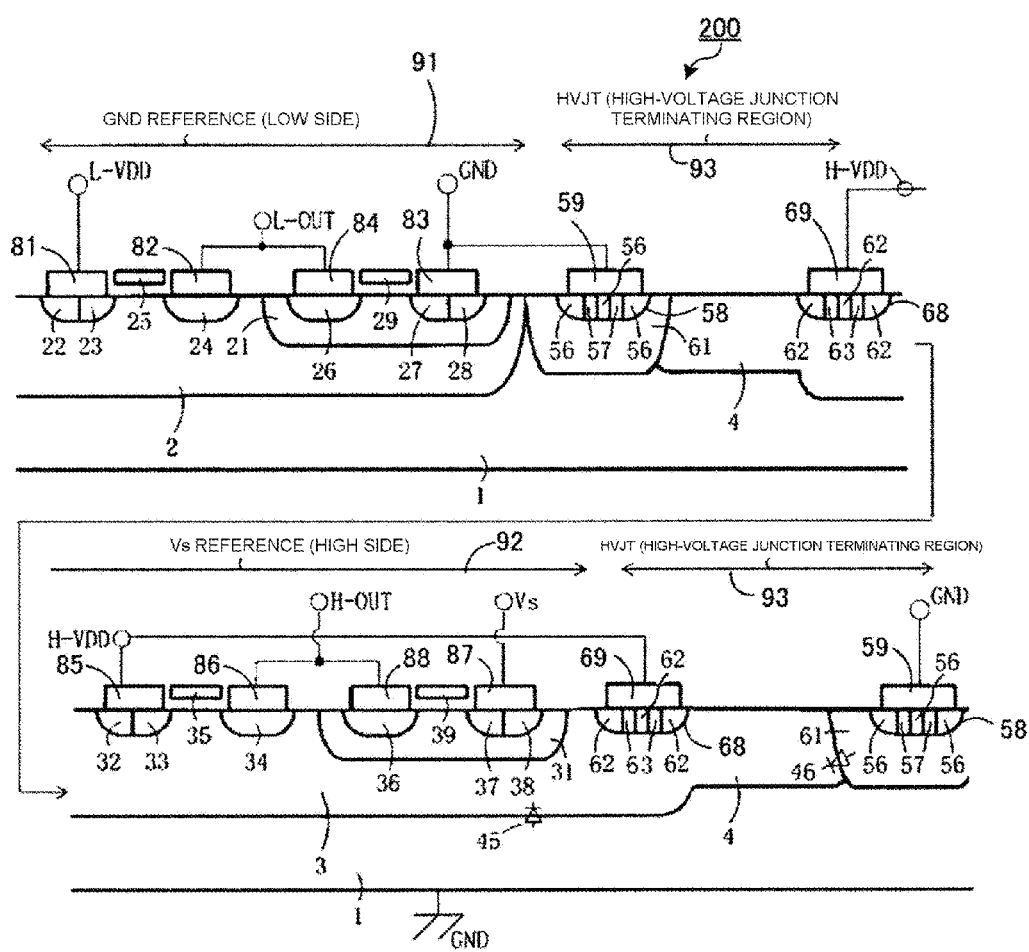
FIG. 4 is a cross-sectional view showing the principal portions of the high-voltage integrated circuit device of Embodiment 2 of the invention.

FIG. 4 is a cross-sectional view showing the principal portions of the high-voltage integrated circuit device of Embodiment 2 of the invention. The high-voltage integrated circuit device 200 of Embodiment 2 differs from the high-voltage integrated circuit device 100 of Embodiment 1 shown in FIG. 1 in that a second universal contact region 68 is also formed under the second pickup electrode 69 connected to the H-VDD terminal. The second universal contact region 68 is formed of n$^+$ regions 62 and p$^+$ regions 63 disposed in mutual alternating contact along the surface of the p semiconductor substrate 1. An explanation is omitted, but the planar pattern of the first universal contact region 58 is the same as the planar pattern (FIG. 2) of the first universal contact region in Embodiment 1.

Figure 5:
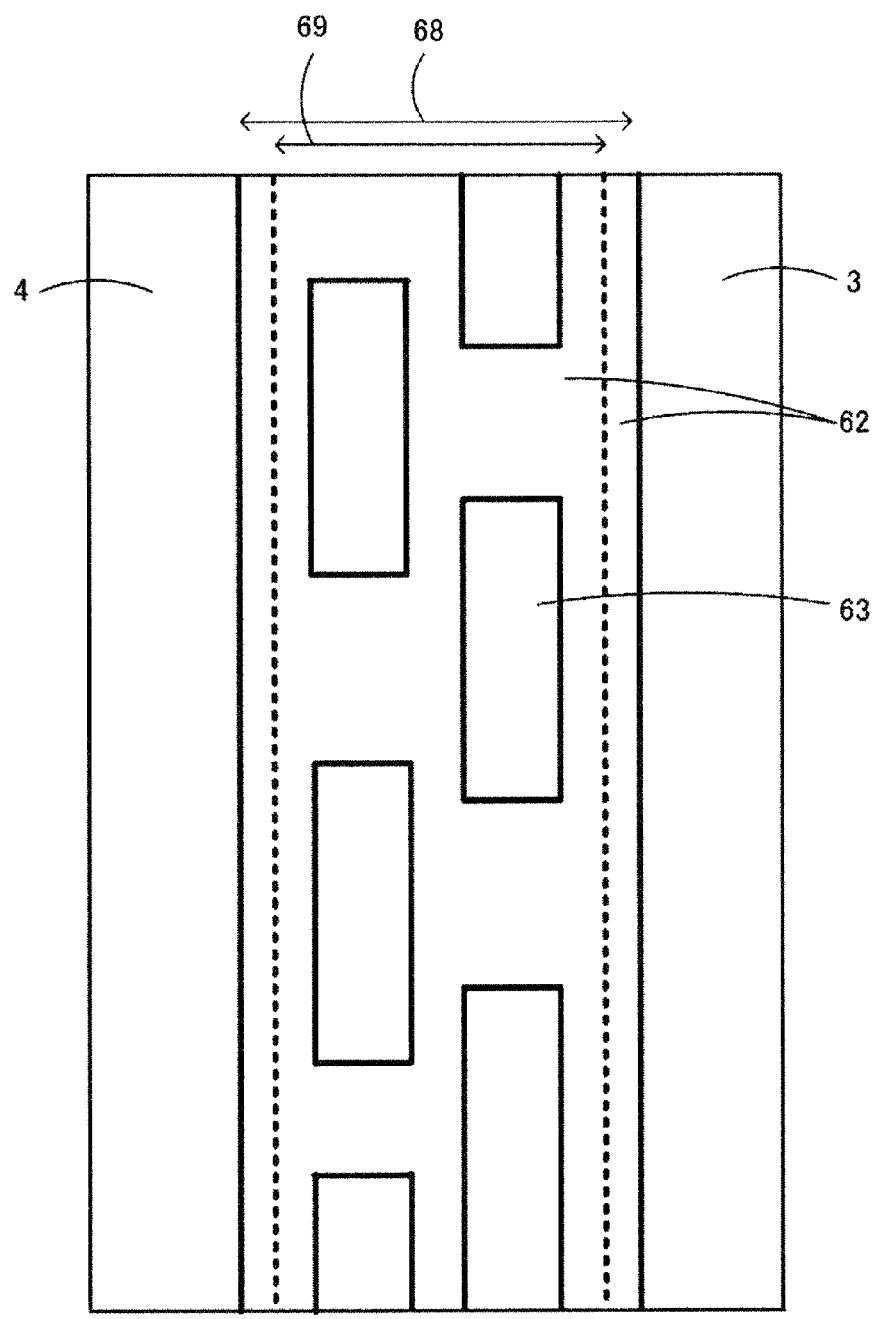
FIG. 5 is a plane view showing the planar pattern of the second universal contact region.

FIG. 5 is a plane view showing the planar pattern of the second universal contact region. The second universal contact region 68 has a rectangular planar shape surrounded by the n$^+$ region 62, and moreover has a planar layout in which numerous p$^+$ regions 63 are disposed in island form. As the planar pattern of the second universal contact region 68, there are also cases in which the planar shapes of the p$^+$ regions 63 disposed in island form may be circular, square, or polygonal. Further, there are also cases in which p$^+$ regions 63 and n$^+$ regions 62 are formed in bands (for example in stripe shapes).

Next, a method of formation of the second universal contact region 68 is explained. The second universal contact region 68 in Ohmic contact with the H-VDD terminal passes through a patterning process using the planar pattern shown in FIG. 5, and for example arsenic is ion-implanted into the n$^+$ region 62 so that the surface concentration is approximately $1 \times 10^{20}/cm^3$. Then, for example BF$_2$ is ion-implanted into the p$^+$ regions 63 so that the surface concentration is approximately $1 \times 10^{20}/cm^3$. Then an annealing process at for example approximately 750° C. to 900° C. is performed to cause diffusion to a depth of approximately 0.2 μm to 0.5 μm, to form the second universal contact region 68.

Figure 6:
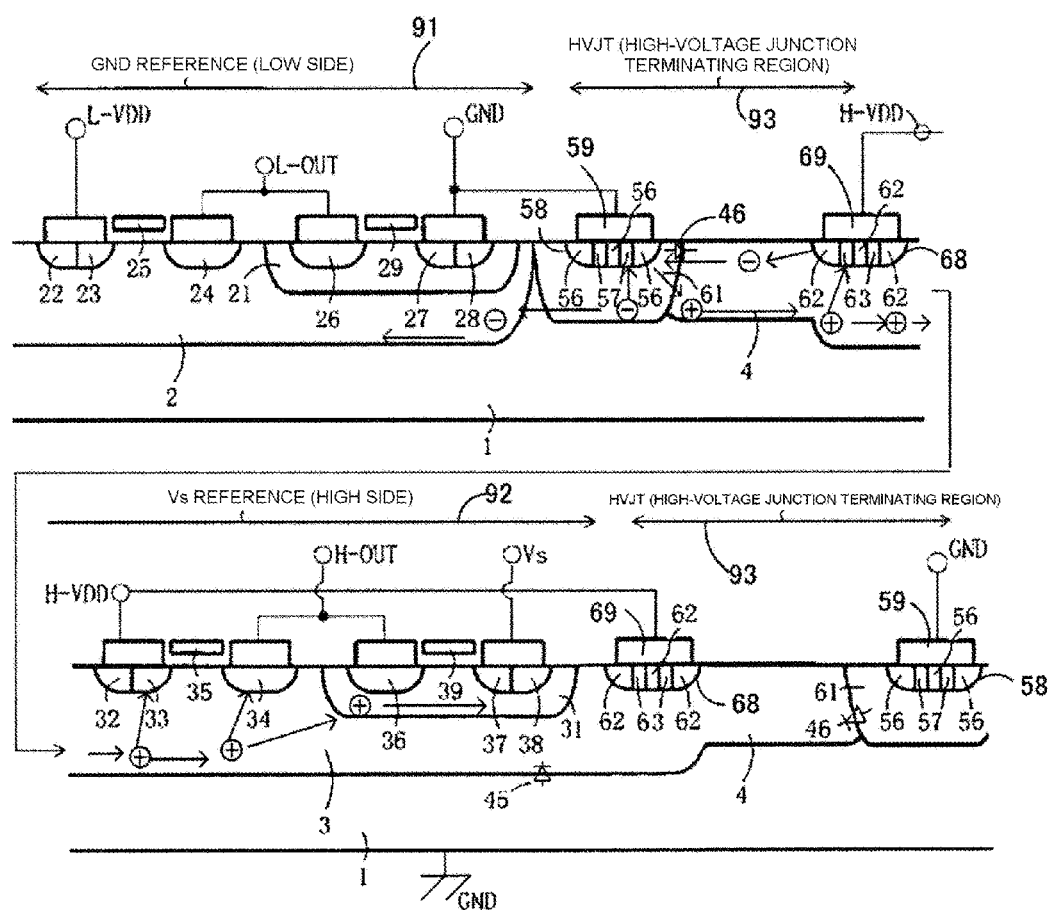
FIG. 6 is an explanatory diagram showing the behavior of electrons and holes when a negative surge voltage is applied via the H-VDD terminal.

FIG. 6 is an explanatory diagram showing the behavior of electrons and holes when a negative surge voltage is applied via the H-VDD terminal. Because there are p$^+$ regions 63 adjacent to the n$^+$ region 62 of the second universal contact region 68, among the current flowing in the parasitic pn diode 46 formed of the p region 61 and the n$^-$ region 4, the quantity of electrons emitted from the n$^+$ region 62 to the n$^-$ region 4 is suppressed. Consequently the quantity of electrons injected from the n$^-$ region 4 into the p region 61 is reduced.

Further, electrons which have entered the p region 61 are pulled from the n$^+$ regions 57 forming the first universal contact region 58. Hence the quantity of electrons entering the n$^-$ region 2 is small compared with the high-voltage integrated circuit device 100 of FIG. 1. As a result, erroneous operation and destruction due to latchup of the logic portion of the low-side circuit portion 91 can be further prevented.

On the other hand, holes are injected as minority carriers from the p region 61 into the n$^-$ region 4 of the parasitic pn diode 46 formed of the p region 61 and n$^-$ region 4, and pass through this n$^-$ region 4 to flow into the n region 3. At this time, a portion of the holes are trapped by the p$^+$ regions 63, the junction barrier of which is higher (approximately 0.6 V higher) than the n region 3, and are pulled into the second pickup electrode 69.

Further, the quantity of holes emitted from the p$^+$ regions 56 of the first universal contact region 58 to the p region 61 is suppressed due to the n$^+$ region 57 adjacent to the p$^+$ regions 56. Hence the quantity of holes injected from the p region 61 into the n$^-$ region 4 of the parasitic pn diode 46 is also reduced, and erroneous operation and destruction due to latchup of the logic portion of the high-side circuit 92 can be prevented.

The area necessary to form the first universal contact region 58 and the second universal contact region 68 is the same as the area of the p$^+$ region 56 which is a conventional first contact region and the n$^+$ region 62 which is a conventional second contact region, shown in FIG. 14. Hence there is no increase in chip size and no increase in manufacturing costs.

As explained above, in Embodiment 2 advantageous results similar to those of Embodiment 1 can be obtained. Further, by forming a second universal contact region 68, disposed in an outer peripheral portion of the high-side circuit portion 92, as a pickup region fixed at the potential of the high-potential side of the power supply of the high-side circuit portion 92, the quantity of carriers flowing into the low-side circuit portion 91 can be reduced, and erroneous operation and destruction due to latchup of the logic portion of the low-side circuit portion 91 can be prevented.

Embodiment 3

Figure 7:
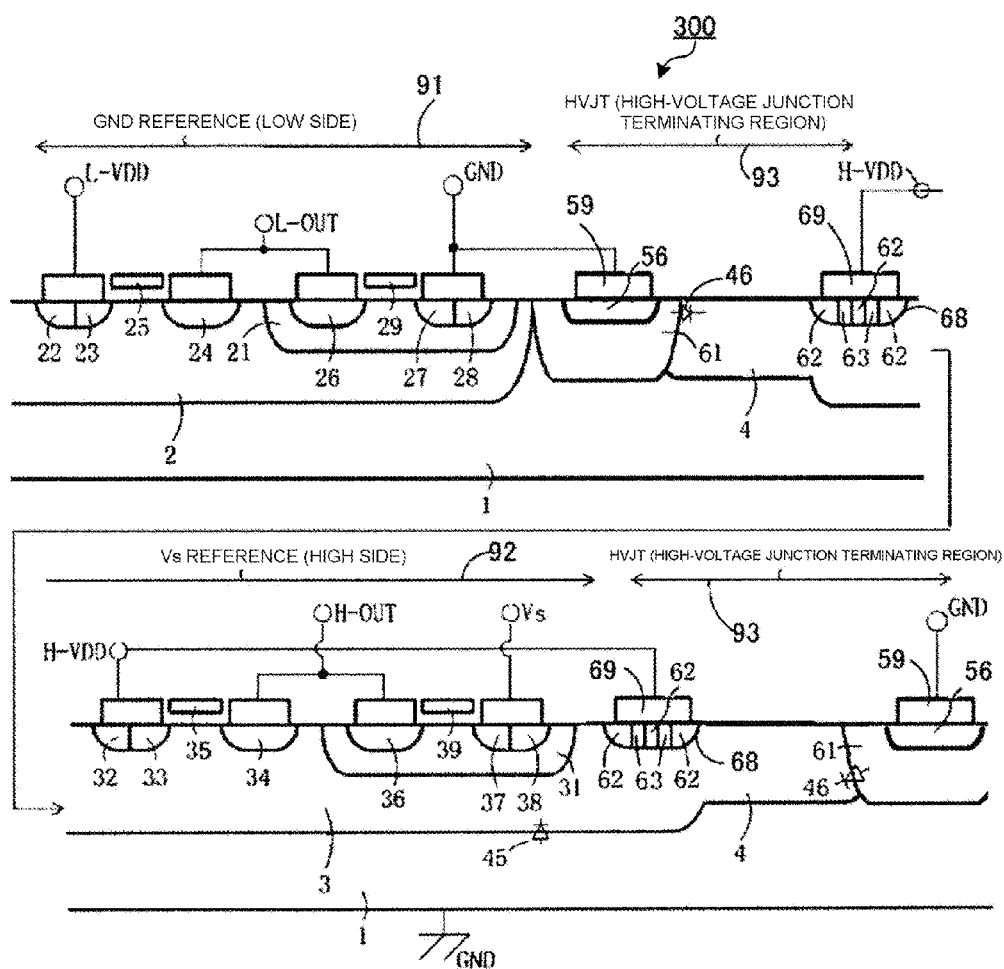
FIG. 7 is a cross-sectional view showing the principal portions of the high-voltage integrated circuit device of Embodiment 3 of the invention.

FIG. 7 is a cross-sectional view showing the principal portions of the high-voltage integrated circuit device of Embodiment 3 of the invention. A difference between the high-voltage integrated circuit device 300 of Embodiment 3 and the high-voltage integrated circuit device 200 of Embodiment 2 in FIG. 4 is that only the second universal contact region 68 is formed, and a first universal contact region 58 is not formed.

By forming the second universal contact region 68, when a negative surge voltage is applied to the H-VDD terminal via the Vs terminal, the quantity of electrons injected into the p region 61 is reduced, as explained in Embodiment 2 referring to FIG. 6. As a result, the quantity of electrons flowing into the n⁻ region 2 is reduced, and erroneous operation and destruction due to latchup of the logic portion of the low-side circuit portion 91 can be prevented.

On the other hand, a portion of the holes injected into the n⁻ region 4 are drawn into the p⁺ regions 63 of the second universal contact region 68, and flow into the second pickup electrode 69. Hence the quantity of holes flowing into the n region 3 is reduced, and erroneous operation and destruction due to latchup of the logic portion of the high-side circuit portion 92 can be prevented.

Further, the area necessary to form the second universal contact region 68 is the same as the area of the n⁺ region 62 which is the conventional second contact region of FIG. 14. Hence there is no increase in chip size and no increase in manufacturing costs.

As explained above, in Embodiment 3, advantageous results similar to those of Embodiment 2 can be obtained.

Embodiment 4

Figure 8:
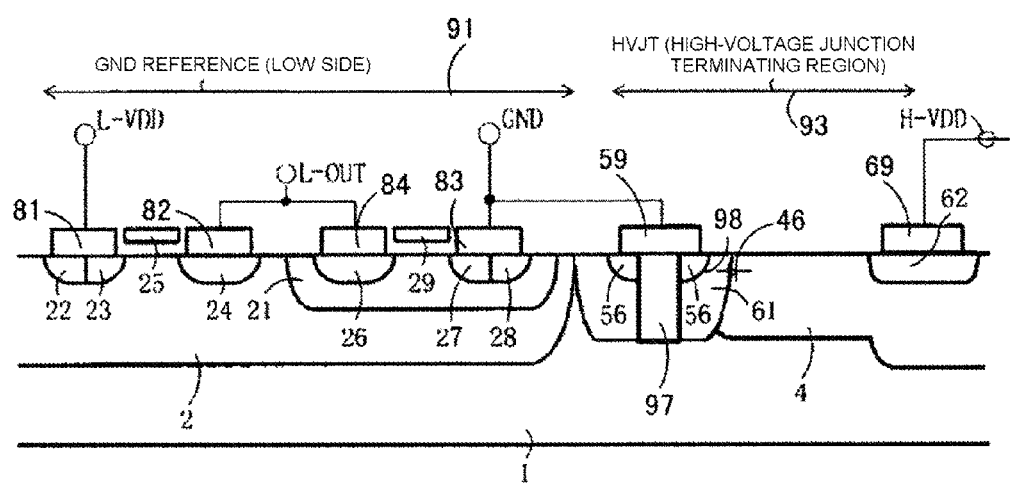
FIG. 8 is a cross-sectional view showing the principal portions of the high-voltage integrated circuit device of Embodiment 4 of the invention.

FIG. 8 is a cross-sectional view showing the principal portions of the high-voltage integrated circuit device of Embodiment 4 of the invention. A difference between the high-voltage integrated circuit device 400 of Embodiment 4 and the high-voltage integrated circuit device 100 of Embodiment 1 in FIG. 1 is that, in place of the n⁺ regions 57 of the first universal contact region 58, a third universal contact region 98 is formed, having an n offset region 97 with a diffusion depth deeper than the p⁺ region 56. The n offset region 97 penetrates the p region 61 and reaches the p semiconductor substrate 1.

This n offset region 97 is formed by passing through the diffusion process at high temperature (approximately 1100 to 1200° C.) used to form a p region 21 which is a p offset region, or ion implantation at a high acceleration of approximately 1 MeV, and an annealing process at approximately 750 to 900° C. which is the same as the n⁺ region 57 driving process, to obtain a diffusion depth of approximately 0.6 μm to 5 μm.

By providing this n offset region 97, when a negative surge voltage is input, minority carrier electrons flowing in the parasitic pn diode 46 formed of the p region 61 and n⁻ region 4 are efficiently trapped by the n offset region 97, and the quantity of electrons flowing into the logic portion (n⁻ region 2) of the low-side circuit portion 91 can be efficiently reduced.

As explained above, in Embodiment 4, advantageous results similar to those of Embodiment 1 can be obtained.

The invention is not limited to the above-described Embodiments 1 to 4, and is also effective in a logic portion of an internal power supply circuit (internal reference voltage circuit) set to lower than an L-VDD potential, and in a logic portion of a pulse generator circuit to drive the gate of a high-voltage n-channel MOSFET which is a level-shifter element. In this invention, these circuits are taken to be included in the low-side circuit portion 91.

As described above, a high-voltage integrated circuit device of this invention is effective as a high-voltage integrated circuit device used when transmitting on/off driving signals to the gate of a power device, for example in a PWM inverter, switching power supply, or similar, and in particular prevents the occurrence of erroneous operation due to the flow of an overcurrent in the circuit.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments and/or drawings can be combined, as would be understood by one of skill in the art.

The invention claimed is:

1. A high-voltage integrated circuit device, comprising:
   a semiconductor substrate of a first conduction type;
   a low-side circuit portion of a second conduction type, disposed on the semiconductor substrate and connected to a low-voltage power supply which takes a GND potential as reference;
   a high-side circuit portion of the second conduction type, disposed on the semiconductor substrate at a distance from the low-side circuit portion and connected to a low-voltage power supply which takes, as reference, an intermediate potential higher than the GND potential;
   a region of the first conduction type which is electrically connected to the GND potential, is disposed surrounding the high-side circuit portion, and forms a high-voltage junction terminating region together with an outer peripheral portion of the low-side circuit portion;
   a first pickup electrode, disposed in the first conduction type region;
   a second pickup electrode, connected to a high-potential side of the low-voltage power supply taking the intermediate potential as reference, and disposed on an inside of the high-voltage junction terminating region and in an outer peripheral portion of the high-side circuit portion;
   a first high-concentration contact region of the first conduction type that is in Ohmic contact with the first pickup electrode; and
   a second high-concentration contact region of the second conduction type that is in Ohmic contact with the second pickup electrode,
   wherein at least one region among the first high-concentration contact region and the second high-concentration contact region is a universal contact region, in which a p region and an n region are disposed in mutual alternating contact along a surface of the semiconductor substrate.

2. The high-voltage integrated circuit device according to claim 1, wherein one of the regions among the p region and the n region forming the universal contact region is surrounded by the other region.

3. The high-voltage integrated circuit device according to claim 1, wherein planar shapes of the p region and the n region forming the universal contact region are both strip shapes.

4. The high-voltage integrated circuit device according to claim 1, wherein, among the p region and the n region forming the universal contact region, the depth of the region of conduction type different from the conduction type of the first conduction type region is equal to or greater than the depth of the first conduction type region.

5. A high-voltage integrated circuit device, comprising:
a semiconductor substrate of a first conduction type;
a first semiconductor region of a second conduction type, including a low-side circuit portion that is disposed on the semiconductor substrate;
a second semiconductor region of the second conduction type, including a high-side circuit portion that is disposed on the semiconductor substrate at a distance from the first semiconductor region;
a first CMOS circuit, which is formed of a first MOSFET having a source region of the first conduction type and a drain region of the first conduction type disposed in a surface layer of the first semiconductor region, a third semiconductor region of the first conduction type disposed in the surface layer of the first semiconductor region at a distance from the first MOSFET, and a second MOSFET having a source region of the second conduction type and a drain region of the second conduction type disposed in a surface layer of the third semiconductor region;
a second CMOS circuit, which is formed of a third MOSFET having a source region of the first conduction type and a drain region of the first conduction type disposed in a surface layer of the second semiconductor region, a fourth semiconductor region of the first conduction type disposed in the surface layer of the second semiconductor region at a distance from the third MOSFET, and a fourth MOSFET having a source region of the second conduction type and a drain region of the second conduction type disposed in a surface layer of the fourth semiconductor region;
a fifth semiconductor region of the first conduction type, disposed in a surface layer of the semiconductor substrate so as to surround the second semiconductor region, and having an impurity concentration higher than the semiconductor substrate;
a first contact region of the first conduction type, disposed in a surface layer of the fifth semiconductor region and having an impurity concentration higher than the fifth semiconductor region;
a high-voltage junction terminating region formed of the fifth semiconductor region and an outer peripheral portion of the second semiconductor region;
a second contact region of the second conduction type, disposed in the surface layer of the second semiconductor region and on the inside of the high-voltage junction terminating region, and having an impurity concentration higher than the second semiconductor region;
a third contact region of the second conduction type, disposed in the surface layer of the first semiconductor region and in contact with the source region of the first MOSFET;
a fourth contact region of the first conduction type, disposed in the surface layer of the third semiconductor region and in contact with the source region of the second MOSFET;
a fifth contact region of the second conduction type, disposed in the surface layer of the second semiconductor region and in contact with the source region of the third MOSFET;
a sixth contact region of the first conduction type, disposed in the surface layer of the fourth semiconductor region and in contact with the source region of the fourth MOSFET;
a first pickup electrode, disposed on the first contact region and in Ohmic contact with the first contact region;
a second pickup electrode, disposed on the second contact region and in Ohmic contact with the second contact region;
a first source electrode, provided in contact with the source region of the first MOSFET and the third contact region;
a first drain electrode, provided in contact with the drain region of the first MOSFET;
a second source electrode, provided in contact with the source region of the second MOSFET and the fourth contact region;
a second drain electrode, provided in contact with the drain region of the second MOSFET;
a third source electrode, provided in contact with the source region of the third MOSFET and the fifth contact region;
a third drain electrode, provided in contact with the drain region of the third MOSFET;
a fourth source electrode, provided in contact with the source region of the fourth MOSFET and the sixth contact region;
a fourth drain electrode, provided in contact with the drain region of the fourth MOSFET;
a GND terminal, connected to the second source electrode and the first pickup electrode; and
a high-potential side terminal, connected to the third source electrode and the second pickup electrode,
wherein at least one region among the first contact region and the second contact region is a universal contact region, in which a p region and an n region are disposed in mutual alternating contact along a surface of the semiconductor substrate.

6. The high-voltage integrated circuit device according to claim 5, wherein, among the p region and the n region forming the universal contact region, the depth of the region of conduction type different from the conduction type of the fifth semiconductor region is equal to or greater than the depth of the fifth semiconductor region.

7. The high-voltage integrated circuit device according to claim 5, wherein the high-side circuit portion is a circuit portion, which is connected to a power supply taking, as a reference potential, a connection point between a switching element of an upper arm and a switching element of a lower arm that form a half-bridge circuit, and which drives the switching element of the upper arm,
the high-potential side terminal is connected to a high-potential side of the power supply, and
the GND terminal is connected to the GND potential.

* * * * *